(12) United States Patent
Choi et al.

(10) Patent No.: US 8,530,329 B2
(45) Date of Patent: Sep. 10, 2013

(54) METHODS OF FABRICATING SEMICONDUCTOR DEVICES HAVING VARIOUS ISOLATION REGIONS

(75) Inventors: Yong-Soon Choi, Yongin-si (KR); Jun-Won Lee, Asan-si (KR); Gil-Heyun Choi, Seoul (KR); Eun-Kee Hong, Seongnam-si (KR); Hong-Gun Kim, Suwon-si (KR); Ha-Young Yi, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 259 days.

(21) Appl. No.: 13/162,050

(22) Filed: Jun. 16, 2011

(65) Prior Publication Data

US 2012/0034757 A1 Feb. 9, 2012

(30) Foreign Application Priority Data

Aug. 5, 2010 (KR) ........................ 10-2010-0075693

(51) Int. Cl.
*H01L 21/78* (2006.01)

(52) U.S. Cl.
USPC ........... 438/427; 438/400; 438/424; 438/935; 257/E21.546

(58) Field of Classification Search
USPC ... 438/400, 424, 427, 435, 437; 257/E21.54, 257/E21.545, E21.546
See application file for complete search history.

(56) References Cited

U.S. PATENT DOCUMENTS

| 7,160,787 B2* | 1/2007 | Heo et al. ...................... 438/424 |
| 7,268,057 B2* | 9/2007 | Ryan et al. ..................... 438/427 |
| 7,763,524 B2* | 7/2010 | Lee ............................... 438/427 |
| 8,232,176 B2* | 7/2012 | Lubomirsky et al. ......... 438/424 |
| 2004/0224496 A1 | 11/2004 | Cui et al. |
| 2004/0248375 A1 | 12/2004 | McNeil et al. |
| 2005/0221579 A1* | 10/2005 | Matsumoto ................... 438/424 |
| 2009/0124061 A1 | 5/2009 | Kiyotoshi |

FOREIGN PATENT DOCUMENTS

| JP | 2009-099909 A | 5/2009 |
| KR | 2009-0011947 A | 2/2009 |

* cited by examiner

*Primary Examiner* — Leonard Chang
(74) *Attorney, Agent, or Firm* — Harness, Dickey & Pierce, P.L.C.

(57) ABSTRACT

A method of fabricating a semiconductor device includes forming a first trench and a second trench in a semiconductor substrate, forming a first insulator to completely fill the first trench, the first insulator covering a bottom surface and lower sidewalls of the second trench and exposing upper sidewalls of the second trench, and forming a second insulator on the first insulator in the second trench.

11 Claims, 19 Drawing Sheets

METHODS OF FABRICATING SEMICONDUCTOR DEVICES HAVING VARIOUS ISOLATION REGIONS

PRIORITY STATEMENT

This application claims the benefit of priority under 35 U.S.C. §119 to Korean Patent Application No. 10-2010-0075693, filed on Aug. 5, 2010, the entire contents of which are incorporated herein by reference.

BACKGROUND

1. Field

Example embodiments of the inventive concepts relate to semiconductor devices having various isolation regions and methods of fabricating the same, and a semiconductor module, an electronic circuit board, a data storage device and an electronic system including the semiconductor devices.

2. Description of Related Art

Semiconductor devices such as a NAND flash memory and a DRAM include various isolation regions formed by forming trenches of various sizes and shapes and filling the trenches using an STI (shallow trench isolation) method.

SUMMARY

Example embodiments of the inventive concepts provide semiconductor devices having various isolation regions and/or methods of fabricating the same. Example embodiments of the inventive concepts provide a semiconductor module, an electronic circuit board and/or a data storage device and/or an electronic system including a semiconductor device having various isolation regions.

Additional aspects and/or advantages of the inventive concepts will be set forth in part in the following detailed description and, in part, will be obvious from the description, or may be learned by practice of the inventive concepts.

According to an example embodiment of the inventive concepts, a method of fabricating a semiconductor device includes forming a first trench and a second trench in a semiconductor substrate, forming a first insulator to completely fill the first trench, the first insulator covering a bottom surface and lower sidewalls of the second trench and exposing upper sidewalls of the second trench, and forming a second insulator on the first insulator in the second trench.

According to an example embodiment of the inventive concepts, a method of fabricating a semiconductor device includes forming a first insulating layer on a semiconductor substrate, forming a first electrode layer on the first insulating layer, forming a trench physically dividing the first insulating layer and the first electrode layer and extending into the semiconductor substrate, the trench including a bottom surface and lower sidewalls exposing the semiconductor substrate and upper sidewalls exposing sidewalls of the first electrode layer, forming a lower insulator on the bottom surface and the lower sidewalls of the trench, the lower insulator including a tensile stressing material, and forming an upper insulator on the lower insulator and the upper sidewalls of the trench, the upper insulator including a compressive stressing material.

According to an example embodiment of the inventive concepts, a method of fabricating a semiconductor device includes forming a plurality of first insulating layers and a plurality of first electrode layers on a semiconductor substrate, forming a plurality of trenches extending into the semiconductor substrate, the plurality of trenches penetrating the plurality of first insulating layers and the plurality of first electrode layers in a vertical direction from a cross-sectional view, forming a plurality of trench insulators completely filling the plurality of trenches, forming a plurality of second insulating layers on the plurality of first electrode layers and the plurality of trench insulators and forming a plurality of second electrode layers on the plurality of second insulating layers.

Conductive structures of semiconductor devices in accordance with the inventive concepts may not be much affected from any isolation regions. Accordingly, performance of the semiconductor devices can be improved and become more stable. Further, methods of fabricating semiconductor devices in accordance with the inventive concepts can provide higher productivity and yield than conventional methods.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION OF EXAMPLE EMBODIMENTS

Figure 1:
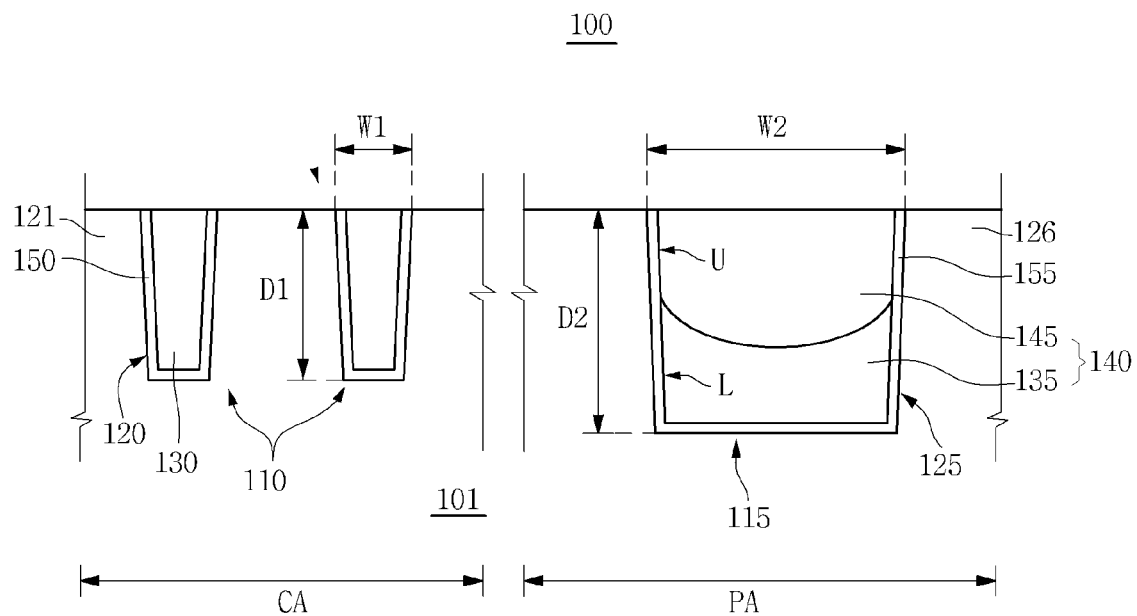
FIGS. 1 to 4B are longitudinal cross-sectional views schematically illustrating semiconductor devices in accordance with example embodiments of the inventive concepts.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This inventive concept, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" with another element, it can be directly connected or coupled to the other element or intervening elements may be present. In contrast, when an element is referred to as being "directly connected" or "directly coupled" with another element, there are no intervening elements present. Other words used to describe the relationship between elements should be interpreted in a like fashion, e.g., "between" versus "directly between," "adjacent" versus "directly adjacent," etc.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to schematic cross-sectional illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the inventive concept is not limited to example embodiments described.

Embodiment 1

FIG. 1 is a longitudinal cross-sectional view schematically illustrating a semiconductor device 100 in accordance with an example embodiment of the inventive concepts.

Referring to FIG. 1, the semiconductor device 100 in accordance with an example embodiment of the inventive concepts may include a semiconductor substrate 101 including a first area CA having a first isolation region 110 and a second area PA having a second isolation region 115.

The semiconductor substrate 101 may be a wafer for semiconductor fabrication. For example, the semiconductor substrate 101 may be a single crystalline silicon wafer, an SOI (silicon on insulator) wafer, a compound semiconductor wafer, or a wafer having an epitaxial silicon layer containing carbon C and/or germanium Ge. The first area CA may be a cell array area having a plurality of memory cells arrayed.

The first isolation region 110 may include an STI (shallow trench isolation). The first isolation region 110 may include a first trench 120 and a first trench insulator 130 filling the first trench 120.

The first trench 120 may be formed in the semiconductor substrate 101 to have a first width W1 and a first depth D1. The first trench 120 may define a cell active region 121.

The first trench insulator 130 may completely fill the first trench 120. Accordingly, the first trench insulator 130 may define the cell active region 121. The first trench insulator 130 may include a tensile stressing material influencing tensile stresses to surrounding materials. For example, the volume of the tensile stressing material may be reduced by thermal treatment processes such as an anneal process or a densification process. The first trench insulator 130 including the tensile stressing material may have flowability and include an organic solution e.g., solvent. For example, the first trench insulator 130 may include an FCVD oxide formed by an FCVD (flowable chemical vapor deposition) process as the tensile stressing material. Thus, the FCVD oxide may have desirable flowability. For example, the FCVD oxide may include a silazene insulator or oxide, e.g., TOSZ (tonen silazene).

The second area PA may be a peripheral circuit area.

The second isolation region 115 may include an STI. The second isolation region 115 may include a second trench 125 and a second trench insulator 140 filling the second trench 125.

The second trench 125 may define a peripheral active region 126.

The second trench 125 may have a second width W2 wider than the first width W1 and a second depth D2 deeper than the first depth D1.

The second trench insulator 140 may include a second lower trench insulator 135 and a second upper trench insulator 145.

The second lower trench insulator 135 may fill about half of the second trench 125. Specifically, the second lower trench insulator 135 may fill a lower portion of the second trench 125. In other words, the second lower trench insulator 135 may be formed on a bottom surface and lower sidewalls L of the second trench 125. The second lower trench insulator 135 may include a tensile stressing material influencing tensile stresses to surrounding materials. The tensile stressing material may be understood by referring to other example embodiments. Accordingly, the second lower trench insulator 135 may also have flowability and include an organic solution, e.g., a solvent. Likewise, the second lower trench insulator 135 may also include an FCVD oxide as the tensile stressing material. Thus, the first trench insulator 130 and the second lower trench insulator 135 may include the same material.

The second upper trench insulator 145 may be formed on the second lower trench insulator 135 and upper sidewalls U of the second trench 125 to completely fill the second trench 125. The second upper trench insulator 145 may include a compressive stressing material influencing compressive stresses to surrounding materials. For example, the volume of the compressive stressing material may increase from thermal treatment processes such as an anneal process. For example, the second upper trench insulator 145 may include middle temperature thermal oxide, HDP (high density plasma) oxide, and/or an USG (undoped silicate glass).

Thus, the second lower trench insulator 135 and the second upper trench insulator 145 may include different insulating materials and/or silicon oxides. For example, the second lower trench insulator 135 may include a material having improved flowability compared with the second upper trench insulator 145.

An interface between the second lower trench insulator 135 and the second upper trench insulator 145 may protrude in a direction from a surface of the semiconductor substrate 101 to a bulk of the semiconductor substrate 101. The interface may have a concave shape in a longitudinal cross-sectional view. Specifically, a vertex of the divider may have a recessed shape from the surface of the semiconductor substrate 101 to the bulk of the semiconductor substrate 101.

The first isolation region 110 and the second isolation region 115 may further include a first trench liner 150 and a second trench liner 155. The first trench liner 150 and the second trench liner 155 may be conformably formed on the bottom surface and sidewalls of the first trench 120 and the second trench 125, respectively. The first trench liner 150 and the second trench liner 155 may include a material which relieves tensile stresses from the first trench insulator 130 and the second lower trench insulator 135 to the semiconductor substrate 101. In other example embodiments, the first trench liner 150 and the second trench liner 155 may include a compressive stressing material influencing compressive stresses to surrounding materials. For example, the first trench liner 150 and the second trench liner 155 may include silicon oxide and/or silicon nitride.

When the first trench liner 150 and the second trench liner 155 include silicon oxide, the first trench liner 150 and the second trench liner 155 may be formed by oxidizing surfaces of the semiconductor substrate 101 exposed in the first trench 120 and the second trench 125. In example embodiments, the first trench liner 150 and the second trench liner 155 may include MTO (middle temperature (thermal) oxide) or LTO (low temperature (thermal) oxide). Alternatively, the first trench liner 150 and the second trench liner 155 may be formed by depositing silicon oxide and/or silicon nitride on the surfaces of the semiconductor substrate 101 exposed in the first trench 120 and the second trench 125.

The first trench liner 150 and the second trench liner 155 may be formed to a relatively thin thickness of about tens of angstroms (Å). In some example embodiments, the first trench liner 150 and the second trench liner 155 may be formed independently of each other. In some example embodiments, the first trench liner 150 and the second trench liner 155 may not be formed. In other words, the first trench insulator 130 may be directly formed on the surface of the semiconductor substrate 101 exposed in the first trench 120, and the second lower trench insulator 135 and the second upper trench insulator 145 may be directly formed on the surface of the semiconductor substrate 101 exposed in the second trench 125.

According to example embodiments, portions of the semiconductor substrate 101 corresponding to the upper sidewalls U of the second trench 125 may be free from the tensile stresses influenced by the second lower trench insulator 135. When the portions of the semiconductor substrate 101 corresponding to the upper sidewalls U of the second trench 125 are stressed by tensile or compressive stresses, their atomic bonds may become unstable. For example, atoms in bonds may move along the stressing directions thus inducing atomic dislocations. Accordingly, the semiconductor device 100 may become electrically and/or physically unstable. According to example embodiments of the inventive concepts, the atomic dislocations can be relieved or prevented from occurring. Thus, the semiconductor device 100 can be electrically and/or physically stable.

Embodiment 2

Figure 2:
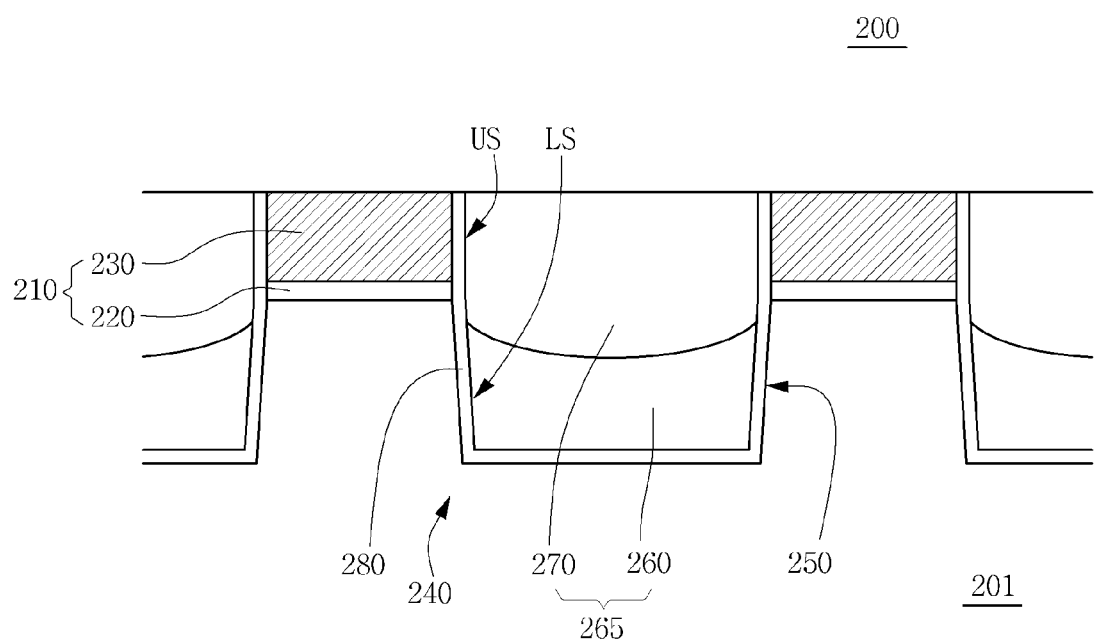

FIG. 2 is a longitudinal cross-sectional view schematically illustrating a semiconductor device 200 in accordance with other example embodiments of the inventive concepts.

Referring to FIG. 2, the semiconductor device 200 in accordance with other example embodiments of the inventive concepts may include a semiconductor substrate 201, an interconnection pattern 210 on the semiconductor substrate 201, and an isolation region 240 in the semiconductor substrate 201.

The semiconductor substrate 201 may be one of the described elements in foregoing example embodiments. The interconnection pattern 210 may include an interconnection insulating layer 220 and an interconnection electrode 230.

The interconnection insulating layer 220 may be directly formed on the semiconductor substrate 201. When the interconnection pattern 210 is a gate pattern, the interconnection insulating layer 220 may be a gate insulating layer. In some example embodiments, when the interconnection pattern 210 is a bit line pattern, the interconnection insulating layer 220 may be one of an insulating liner, an insulating barrier layer, a buffer layer, an etching stopper or a capping layer. In an example embodiment, the interconnection insulating layer 220 may include at least one of silicon oxide, silicon nitride, silicon oxynitride, hafnium oxide, aluminum oxide, tantalum oxide, or other insulating materials.

The interconnection electrode 230 may be directly formed on the interconnection insulating layer 220 to be aligned with sidewalls of the interconnection insulating layer 220. The interconnection electrode 230 may be electrically isolated or physically isolated by the isolation region 240. In other words, the isolation region 240 may vertically penetrate the interconnection electrode 230 and the interconnection insulating layer 220, and extend into the semiconductor substrate 201. The interconnection electrode 230 may be arrayed in lines, lattice shapes, bar shapes, or island shapes in a plan view. When the interconnection pattern 210 is a gate pattern, the interconnection electrode 230 may be a gate electrode. When the interconnection pattern 210 is a bit line pattern, the interconnection electrode 230 may be a bit line electrode. In the example embodiments, the interconnection electrode 230 may include at least one of silicon, a metal, a metal silicide, a metal compound, a metal alloy, or other conductive materials.

The isolation region 240 may include an STI. The isolation region 240 may include a trench 250 and a trench insulator 265 filling the trench 250.

The trench 250 having a recessed shape or a groove shape may be formed in the semiconductor substrate 201. The trench 250 may electrically and/or physically isolate the interconnection pattern 210.

The trench insulator 265 may include a lower trench insulator 260 and an upper trench insulator 270. The lower trench insulator 260 may be formed on a bottom surface and lower sidewalls LS of the trench 250 to fill the trench 250. Further, the lower trench insulator 260 may not be formed on upper sidewalls US of the trench 250.

The upper sidewalls US of the trench 250 may correspond to sidewalls of the interconnection electrode 230. The upper trench insulator 270 may be formed on an upper surface of the lower trench insulator 260 and on the upper sidewalls US of the interconnection patterns 210.

The lower trench insulator 260 may include a tensile stressing material influencing tensile stresses to surrounding materials. The tensile stressing material may be understood by referring to the foregoing example embodiments.

The upper trench insulator 270 may include a compressive stressing material influencing compressive stresses to surrounding materials. The compressive stressing material may be understood by referring to the foregoing example embodiments.

The lower trench insulator 260 may have improved flowability compared with the upper trench insulator 270. For example, the lower trench insulator may include an FCVD oxide referring to the foregoing example embodiments. For example, the upper trench insulator 270 may include MTO, LTO, HDP oxide, or USG.

The lower trench insulator 260 and the upper trench insulator 270 may include different insulating materials and/or silicon oxides from each other. The lower trench insulator 260 may include a material having improved flowability compared with the upper trench insulator 270.

An interface between the lower trench insulator 260 and the upper trench insulator 270 may protrude in a direction from a surface of the semiconductor substrate 201 to a bulk of the semiconductor substrate 201. The interface may have a concave shape in a longitudinal cross-sectional view.

The isolation region 240 may further include a trench liner 280. The trench liner 280 may be conformably formed on sidewalls and a bottom surface of the trench 250. The trench liner 280 may include compressive or tensile stressing materials influencing compressive or tensile stresses to surrounding materials. When the tensile stresses of the lower trench insulator 260 are greater than the compressive stresses of the upper trench insulator 270, the trench liner 280 may include a compressive stressing material. Otherwise, when the compressive stresses of the upper trench insulator 270 are greater than the tensile stressed of the lower trench insulator 260, the trench liner 280 may include a tensile stressing material.

The trench liner 280 may include at least one insulating material e.g., silicon oxide, silicon nitride, or silicon oxynitride. The trench liner 280 may be formed by oxidizing a surface of the semiconductor substrate 201 exposed in the trench 250. The trench liner 280 may include MTO or LTO. In some example embodiments, the trench liner 280 may be formed by depositing silicon oxide or silicon nitride on the surface of the semiconductor substrate 201 exposed in the trench 250. The trench liner 280 may be formed to a relatively thin thickness of tens of angstroms (Å). Alternatively, the trench liner 280 may not be formed. Specifically, the lower trench insulator 260 and the upper trench insulator 270 may be directly formed on the surface of the semiconductor substrate 201 exposed in the trench 250. According to example embodiments of the inventive concepts, the interconnection electrode 230 may be free from the tensile stresses of the lower trench insulator 260.

Embodiment 3

Figure 3A:
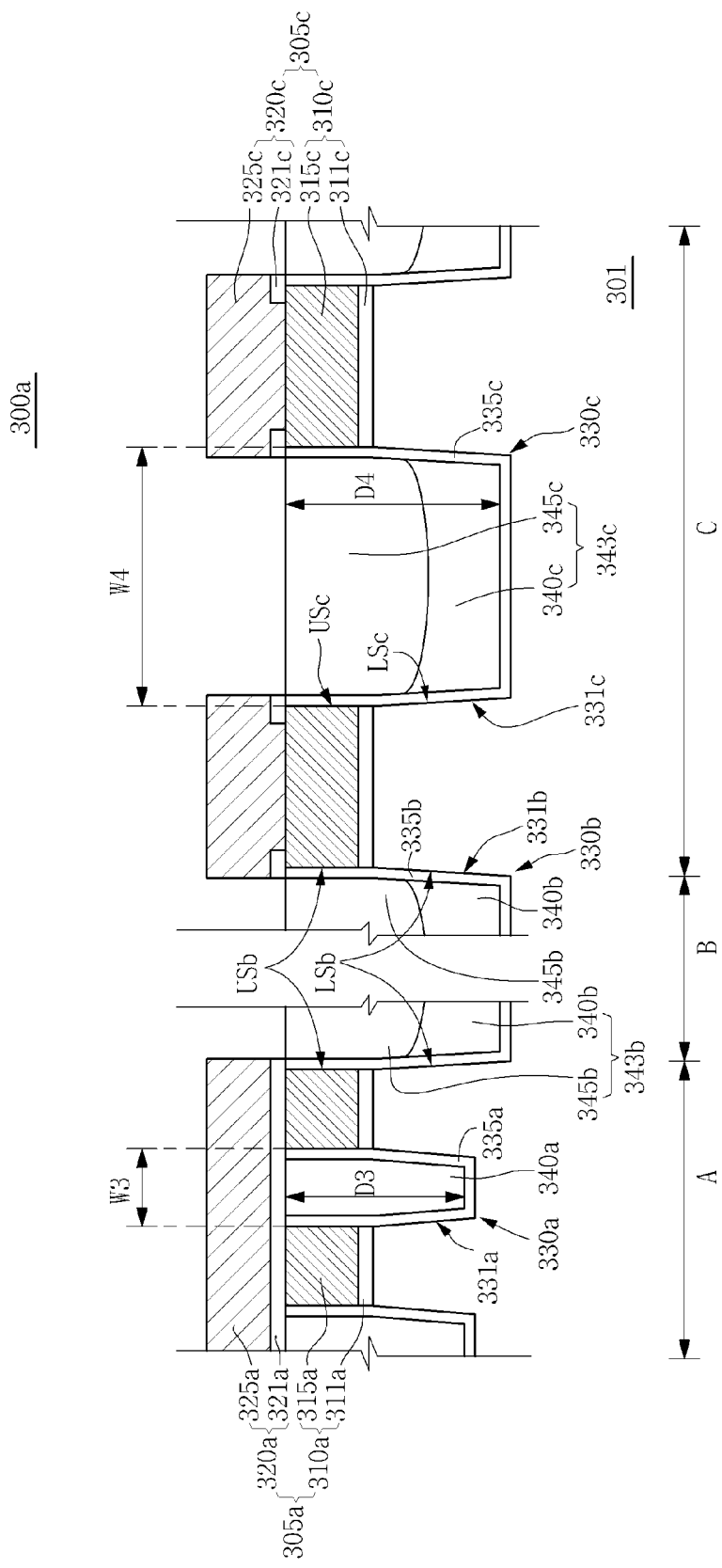

FIG. 3A is a longitudinal cross-sectional view schematically illustrating a semiconductor device 300a in accordance with other example embodiments of the inventive concepts.

Referring to FIG. 3A, the semiconductor device 300a in accordance with an example embodiment of the inventive concepts may include a semiconductor substrate 301 having a first area A, a second area B, and a third area C.

The semiconductor substrate 301 may be understood by referring the foregoing descriptions and example embodiments. The first area A may be a cell array area having a plurality of memory cells arrayed. The first area A may include a cell interconnection pattern 305a and a cell isolation region 330a.

The cell interconnection pattern 305a may include a lower cell interconnection pattern 310a and an upper cell interconnection pattern 320a. The lower cell interconnection pattern 310a may include a lower cell interconnection insulating layer 311a and a lower cell interconnection electrode 315a.

The lower cell interconnection insulating layer 311a may be directly formed on the semiconductor substrate 301. The lower cell interconnection insulating layer 311a may be physically isolated by the cell isolation region 330a. In other words, the cell isolation region 330a may vertically penetrate the lower cell interconnection insulating layer 311a and extend into the semiconductor substrate 301. When the semiconductor device 300a is a FLASH memory device, the lower cell interconnection insulating layer 311a may be a tunneling insulating layer. On the other hand, when the semiconductor device 300a is a DRAM device, the lower cell interconnection insulating layer 311a may be a word line insulating layer or a bit line insulating layer. The lower cell interconnection insulating layer 311a may include at least one of silicon oxide, silicon nitride, silicon oxynitride, hafnium oxide, aluminum oxide, tantalum oxide, or other insulating materials.

The lower cell interconnection electrode 315a may be directly formed on the lower cell interconnection insulating layer 311a to be aligned with sidewalls of the lower cell interconnection insulating layer 311a. The lower cell interconnection electrode 315a may be electrically and/or physically isolated by the cell isolation region 330a. In other words, the cell isolation region 330a may vertically penetrate the lower cell interconnection electrode 315a and the lower cell interconnection insulating layer 311a, and extend into the semiconductor substrate 301. The lower cell interconnection electrode 315a may be arrayed in lines, lattice shapes, bar shapes, or island shapes in a plan view. The lower cell interconnection electrode 315a may include at least one of silicon, a metal, a metal silicide, a metal compound, a metal alloy, or other conductive materials. When the semiconductor device is a FLASH memory device, the lower cell interconnection electrode 315a may be a floating gate electrode. When the semiconductor device 300a is a CTF (charge trap flash) memory device, the lower cell interconnection electrode 315a may be a charge trap layer formed to a thickness thinner than in the scale of the drawings. In an example embodiment, the lower cell interconnection electrode 315a may include silicon nitride or a dielectric material having higher permittivity than that of silicon nitride. In some example embodiments, when the semiconductor device 300a is a DRAM device, the lower cell interconnection electrode 315a may be a word line, a bit line or an active region.

The cell isolation region 330a may include an STI. The cell isolation region 330a may include a cell trench 331a and a cell trench insulator 340a filling the cell trench 331a.

The cell trench 331a may be formed in the semiconductor substrate 301 as a groove shape to electrically and/or physically isolate the lower cell interconnection pattern 310a. The cell trench 331a may have a third width W3 and a third depth D3.

The cell trench insulating layer 340a may completely fill the cell trench 331a. The cell trench insulator 340a may include a tensile stressing material influencing tensile stresses to surrounding materials. The tensile stressing material may include an oxide material having desirable flowability, e.g., an FCVD oxide referring to the foregoing example embodiments.

The cell trench liner 335a may be conformably formed on a bottom surface and sidewalls of the cell trench 331a. The cell trench liner 335a may relieve tensile stresses from the cell trench insulator 340a to the semiconductor substrate 301 and/or the lower cell interconnection electrode 315a. The cell trench liner 335a may include a compressive stressing material influencing compressive stresses to surrounding materials. For example, the cell trench liner 335a may include silicon oxide and/or silicon nitride. The cell trench liner 335a may be formed by oxidizing a surface of the semiconductor substrate 301 exposed in the cell trench 331a. The cell trench liner 335a may include MTO or LTO. On the other hand, the cell trench liner 335a may be formed by depositing silicon oxide and/or silicon nitride on the surface of the semiconductor substrate 301 exposed in the cell trench 335a. The cell trench liner 335a may be formed to a thin thickness of about tens of angstroms (Å). The cell trench liner 335a may not be formed. Accordingly, the cell trench insulator 340a may be directly formed on the surface of the semiconductor substrate 301 exposed in the cell trench 331a and/or on the sidewalls of the lower cell interconnection electrode 315a. According to example embodiment of the inventive concepts, the lower cell interconnection electrode 315a may be free from the tensile stresses of the cell trench insulator 340a.

The upper cell interconnection pattern 320a may be formed on at least two of the lower cell interconnection patterns 310a and the cell isolation regions 330a.

The upper cell interconnection pattern 320a may be formed to cover the lower cell interconnection pattern 310a and cross the cell isolation region 330a. The upper cell interconnection pattern 320a may include an upper cell interconnection insulating layer 321a and an upper cell interconnection electrode 325a.

The upper cell interconnection insulating layer 321a may be formed directly on the lower cell interconnection electrode 315a. When the semiconductor device is a FLASH memory device, the cell interconnection insulating layer 321a may be an inter-gate insulating layer or a blocking insulating layer. When the semiconductor device is a DRAM device, the cell interconnection insulating layer 321 may be a word line insulating layer or a bit line insulating layer. The cell interconnection insulating layer 321a may include at least one of silicon oxide, silicon nitride, silicon oxynitride, hafnium oxide, aluminum oxide, tantalum oxide, or other insulators.

The upper cell interconnection electrode 325a may be directly formed on the upper cell interconnection insulating layer 321a to be aligned with sidewalls of the upper cell interconnection insulating layer 321a. When the semiconductor device 300a is a FLASH memory device, the upper cell interconnection electrode 325a may be a control gate electrode. When the semiconductor device 300a is a DRAM device, the upper cell interconnection electrode 325a may be a word line electrode or a bit line electrode. The upper cell interconnection electrode 325a may include at least one of silicon, a metal, a metal silicide, a metal compound, a metal alloy or other conductive materials.

The second area B may be a core area adjacent to the first area A. The second area B may include a core isolation region 330b.

The core isolation region 330b may include a core trench 331b and a core trench insulator 343b filling the core trench 331b. The core trench 331b may be formed to be wider and deeper than the cell trench 331.

The core trench insulator 343b may include a lower core trench insulator 340b and an upper core trench insulator 345b.

The lower core trench insulator 340b may be formed on a bottom surface and lower sidewalls LSb of the core trench 331b. Furthermore, the lower core trench insulator 340b may not be formed on upper sidewalls USb of the core trench 331b. The upper sidewalls USb of the core trench 331b may be sidewalls of the lower cell interconnection electrode 315a.

The lower core trench insulator 340b may include a tensile stressing material influencing tensile stresses to surrounding materials. For example, the volume of the lower core trench insulator 340b may be reduced by thermal treatment processes such as an anneal process or a densification process. The lower core trench insulator 340b may have improved flowability compared with the upper core trench insulator 345b. For example, the lower core trench insulator 340b may include an FCVD oxide referring to the foregoing example embodiments.

The upper core trench insulator 345b may include a compressive stressing material influencing compressive stresses to surrounding materials. For example, the volume of the upper core trench insulator 345b may increase from an anneal process. For example, the upper core trench insulator 345b may include MTO, LTO, HDP oxide, or USG. The lower core trench insulator 340a and the upper core trench insulator 345a may include different insulating materials and/or silicon oxides.

The upper core trench insulator 345b may be formed an upper surface of the lower core trench insulator 340b and upper sidewalls USb of the lower cell interconnection electrode 315a. An interface between the lower core trench insulator 345b and the upper core trench insulator 345b may protrude in a direction from a surface of the semiconductor substrate 301 to a bulk of the semiconductor substrate 301. The interface between the lower core trench insulator 340b and the upper core trench insulator 345b may have a concave shape in longitudinal cross-sectional views.

The core trench liner 335b may be conformably formed on a bottom surface and sidewalls of the core trench 331b. The core trench liner 335b may include a material which relieves tensile stresses from the lower core trench insulator 340b to the semiconductor device 301 or the lower cell interconnection electrode 315a. The core trench liner 335b may include a compressive stressing material influencing compressive stresses to surrounding materials. The core trench liner 335b may include silicon oxide or silicon nitride. The core trench liner 335b may include the same material included in the cell trench liner 335a.

The third area C may be a peripheral circuit area having a plurality of CMOS transistors arrayed. The third region C may include a peripheral interconnection pattern 305c and a peripheral isolation region 330c.

The peripheral interconnection pattern 305c may include a lower peripheral interconnection pattern 310c and an upper peripheral interconnection pattern 320c. The lower peripheral interconnection pattern 310c may include a lower peripheral interconnection insulating layer 311c and a lower peripheral interconnection electrode 315c.

The lower peripheral interconnection insulating layer 311c may be directly formed on the semiconductor substrate 301. The lower peripheral interconnection insulating layer 311c may be physically or electrically isolated by the peripheral isolation region 330c. In other words, the peripheral isolation region 330c may vertically penetrate the lower peripheral interconnection insulating layer 311c and extend into the semiconductor substrate 301. When the peripheral interconnection pattern 305c is a CMOS transistor, the lower peripheral interconnection insulating layer 311c may be a transistor insulating layer. The lower peripheral interconnection insulating layer 311c may include at least one of silicon oxide, silicon nitride, silicon oxynitride, hafnium oxide, aluminum oxide, tantalum oxide, or other insulating materials.

The lower peripheral interconnection electrode 315c may be directly formed on the lower peripheral interconnection insulating layer 311c to be aligned with sidewalls of the lower peripheral interconnection insulating layer 311c. The lower peripheral interconnection electrode 315c may be electrically and/or physically isolated by the peripheral isolation region 330c. In other words, the peripheral isolation region 330c may vertically penetrate the lower peripheral interconnection electrode 315c and the lower peripheral interconnection insulating layer 311c, and extend into the semiconductor substrate 301. The lower peripheral interconnection electrode 315c may be arrayed in lines, lattice shapes, bar shapes, or island shapes in a plan view. The lower peripheral interconnection electrode 315c may be a gate electrode. The lower peripheral interconnection electrode 315c may include at least one of silicon, a metal, a metal silicide, a metal compound, a metal alloy, or other conductive materials.

The upper peripheral interconnection pattern 320c may include an upper peripheral interconnection insulating layer 321c and an upper peripheral interconnection electrode 325c.

The upper peripheral interconnection insulating layer 321c may be partially formed between the lower peripheral interconnection electrode 315c and the upper peripheral interconnection electrode 325c. The upper peripheral interconnection insulating layer 321c may be formed as lines being aligned with the lower peripheral interconnection electrode 315c and/or the lower peripheral interconnection insulating layer 311c. The upper peripheral interconnection insulating layer 321c may include at least one of silicon oxide, silicon nitride, silicon oxynitride, hafnium oxide, aluminum oxide, tantalum oxide, or other insulating materials.

The upper peripheral interconnection electrode 325c may be formed as lines being aligned with the lower peripheral interconnection electrode 315c and/or the upper peripheral interconnection insulating layer 321c. When the peripheral interconnection pattern 305c is a transistor pattern, the upper peripheral interconnection electrode 325c may be used as a main gate electrode.

The peripheral isolation region 330c may include a peripheral trench 331c and a peripheral trench insulator 343c filling the peripheral trench 331c. The peripheral trench 331c may be formed as a fourth width W4 wider than the third width W3 of the cell trench 331a. The peripheral trench 331c may be formed as a fourth depth D4 deeper than the third depth D3 of the cell trench 331a. The core trench 331b may be equal in width to or wider than the fourth width W4 and equal in width to or deeper than the fourth depth D4. That is, the core trench 331b may be formed wider and deeper than the peripheral trench 331c.

The peripheral trench insulator 343c may include a lower peripheral trench insulator 340c and an upper peripheral trench insulator 345c. The lower peripheral trench insulator 340c may be formed on a bottom surface and lower sidewalls LSc of the peripheral trench 331c. In addition, the lower peripheral trench insulator 340c may not be formed on upper sidewalls USc of the peripheral trench 331c. The upper sidewalls USc of the peripheral trench 331c may be sidewalls of the lower peripheral interconnection electrode 315c. The lower peripheral trench insulator 340c may also include a tensile stressing material influencing tensile stresses to surrounding materials. The tensile stressing material may be understood by referring to the foregoing example embodiments. The lower peripheral trench insulator 340c may include the same material included in the lower core trench insulator 340b. The upper peripheral trench insulator 345c may be formed on a surface of the lower peripheral trench insulator 340c and the sidewalls USc of the lower peripheral trench electrode 315c. An interface between the lower peripheral trench insulator 340c and the upper peripheral trench insulator 345c may protrude in a direction from a surface of the semiconductor substrate 301 to the bulk of a semiconductor substrate 301. That is, the interface may have a concave shape in longitudinal cross-sectional views.

The upper peripheral trench insulator 345c may include a compressive stressing material influencing compressive stresses to surrounding materials. The compressive stressing material may be understood by referring to the foregoing example embodiments. For example, the upper peripheral trench insulator 345c may include at least one of MTO, LTO, HDP oxide, or USG. The lower peripheral trench insulator 340c and the upper peripheral trench insulator 345c may include different insulating materials and/or silicon oxides.

A peripheral trench liner 335c may be conformably formed on the bottom surface and sidewalls of the peripheral trench 331c. The peripheral trench liner 335c may relieve tensile stresses from the lower peripheral trench insulator 340 to the semiconductor substrate 301 or the lower peripheral interconnection electrode 315c. In other words, the peripheral trench liner 335c may include a compressive stressing material influencing compressive stresses to surrounding materials. Otherwise, the peripheral trench liner 335c may relieve compressive stresses from the upper peripheral trench insulator 345c to the semiconductor substrate 301 of the lower peripheral interconnection electrode 315c. That is, the peripheral trench liner 335c may include a tensile stressing material influencing tensile stresses to surrounding materials. The peripheral trench liner 335c may include silicon oxide and/or silicon nitride. The peripheral trench liner 335c may include the same material included in the cell trench liner 335a and/or the core trench liner 335b.

According to example embodiment of the inventive concepts, the lower cell interconnection electrode 315a and the lower peripheral interconnection electrode 315c may be free from the tensile stresses being influenced by the lower core trench insulator 340b and the lower peripheral trench insulator 340c. When the lower cell interconnection electrode 315a and the lower peripheral interconnection electrode 315c are influenced by tensile or compressive stresses, their atomic bonds may become unstable. For example, atoms in bond may move along the tensile stresses directions. The effects may induce atomic dislocations and affect conductivity. Accordingly, the semiconductor device 100 may become electrically and/or physically unstable. According to example embodiments of the inventive concepts, the atomic dislocations in the lower cell interconnection electrode 315a and the lower peripheral interconnection electrode 315c can be relieved and prevented from occurring. Thus, the lower cell interconnection electrode 315a and the lower peripheral interconnection electrode 315c of the semiconductor device 300a can be electrically and or physically stable.

Embodiment 4

Figure 3B:
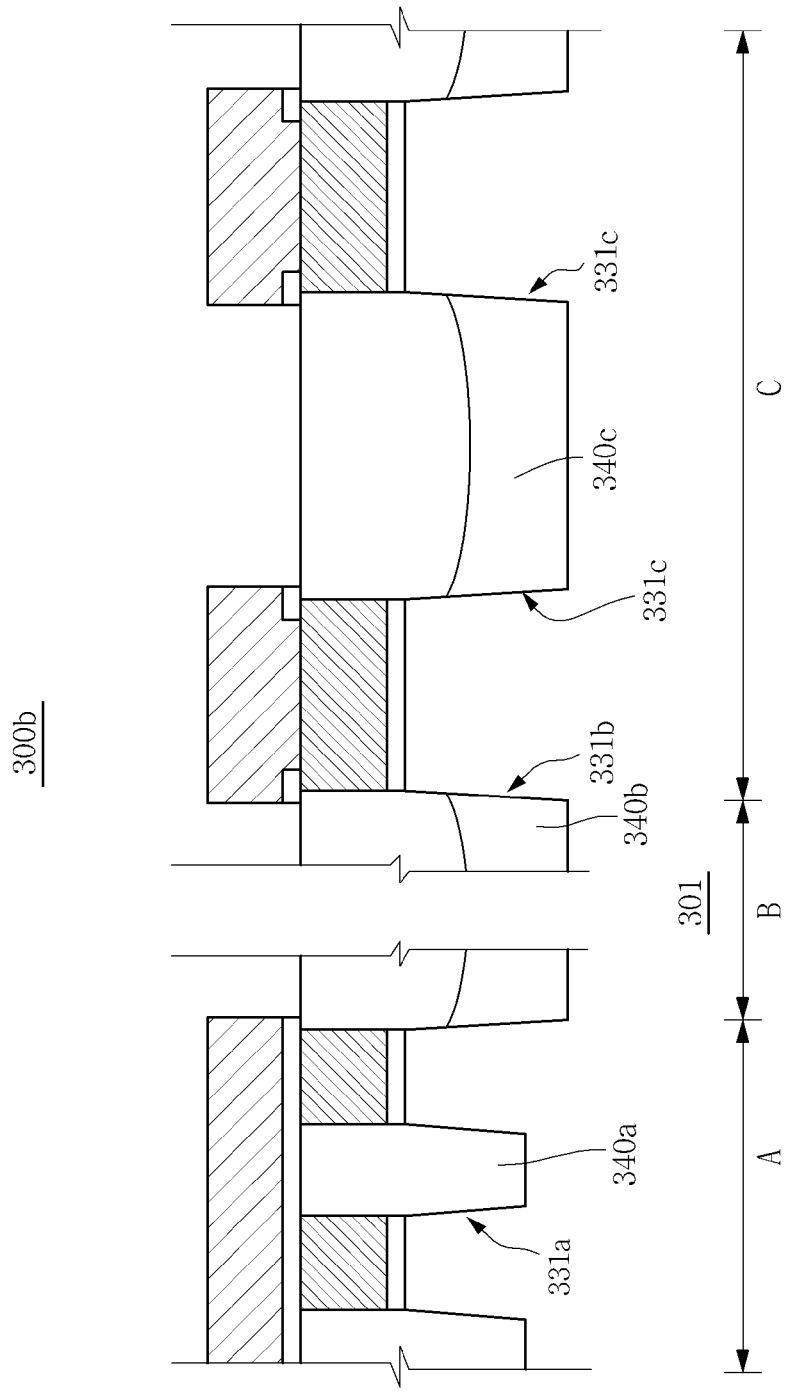

FIG. 3B is a longitudinal cross-sectional view schematically illustrating a semiconductor device 300b in accordance with other example embodiments of the inventive concepts. Referring to FIG. 3B, in comparison with the semiconductor device 300a in FIG. 3A, the semiconductor device 300b may not include trench liners such as the cell trench liner 335a, the core trench liner 335b, and the peripheral trench liner 335c. Because the semiconductor device 300b does not have any trench liners, filling processes in the trenches 331a, 331b, and 331c with trench insulators can be simpler. According to the example embodiment, gap-fill characteristics of the trenches 331a, 331b, and 331c can be improved. On the other hand, tensile stresses influencing the lower cell interconnection electrode 315a (see FIG. 3A), the peripheral interconnection electrode 315c (see FIG. 3A), and the semiconductor substrate 301 from the cell trench insulator 340a, the lower core trench insulator 340b, and the lower peripheral trench insulator 340c, may not be sufficiently relieved.

In the example embodiment, to compensate for the effects, various processes, e.g., deposition process or anneal process, of forming the cell trench insulator 340a, the lower core trench insulator 340b, and the lower peripheral trench insulator 340c may be performed under relatively low temperatures. For example, the deposition process and/or anneal process may be performed at a range of about 200 to 600° C., more specifically, at about 400° C. On the other hand, processes of forming the cell trench insulator 340a, the lower core trench insulator 340b, and the lower peripheral trench insulator 340c may be performed relatively slow. When the processes are preformed relatively slower, the tensile or compressive stresses by the cell trench insulator 340a, the lower core trench insulator 340b, and the lower peripheral trench insulator 340c can be relatively relieved. Otherwise, when the trench liners 335a, 335b, and 335c are formed, processes of forming the cell trench insulator 340a, the lower core trench insulator 340b, and the lower peripheral trench insulator 340c can be performed at relatively high temperatures.

Embodiment 5

Figure 4A:
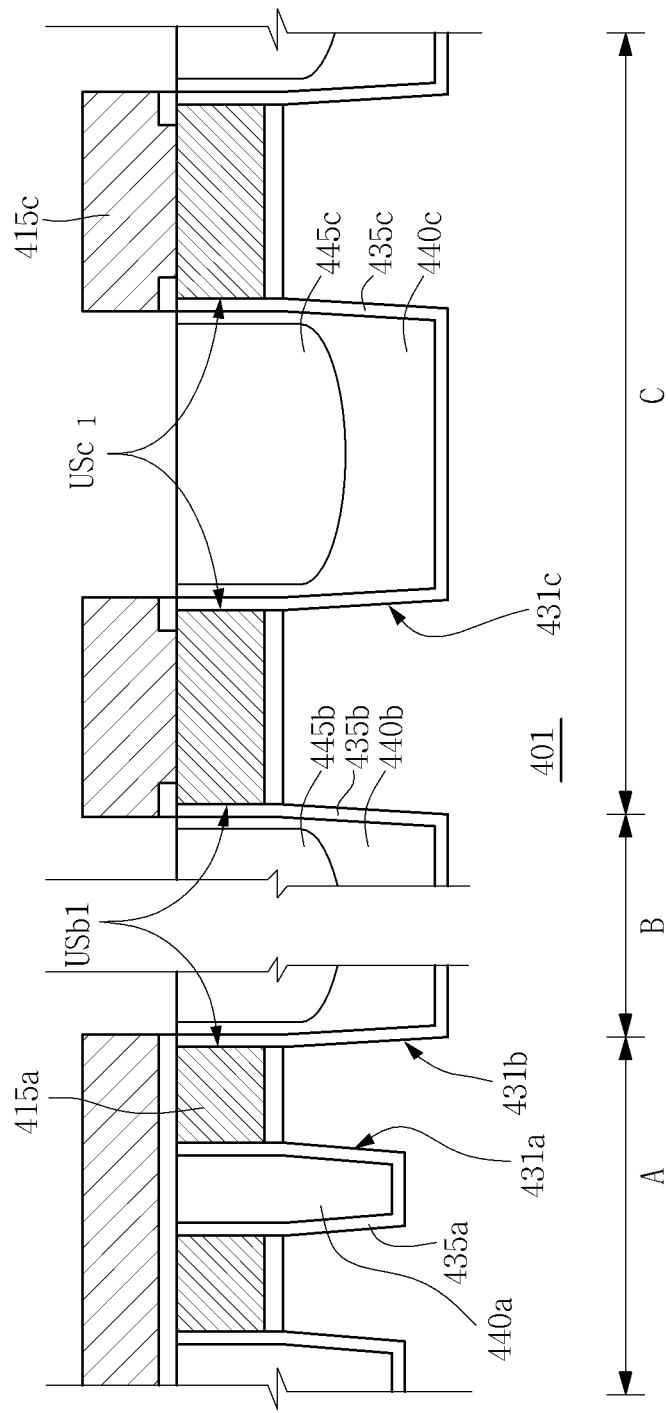

FIG. 4A is a longitudinal cross-sectional view illustrating a semiconductor device 400a in accordance with other example embodiments of the inventive concepts. Referring to FIG. 4A, in comparison with the semiconductor device 300a in FIG. 3A, the semiconductor device 400a may include a lower trench insulator 440b filling the lower insides of a core trench 431b and thinly formed on upper sidewalls USb1 of the core trench 431b. The upper sidewalls USb1 of the core trench 431b may be sidewalls of a lower cell interconnection electrode 415a. The lower core trench insulator 440b may be formed in the core trench 431b like a cup shape in a longitudinal cross-sectional view. A lower peripheral trench insulator 440c may fill the lower insides of a peripheral trench 431c and may be thinly formed on upper sidewalls USc1 of the peripheral trench 431c. The upper sidewalls USc1 of the peripheral trench 431c may be sidewalls of a lower peripheral interconnection electrode 415c. The lower peripheral trench insulator 440c may also be formed in the peripheral trench 431c as a cup shape in a longitudinal cross-sectional view. According to the example embodiment, the tensile stresses influencing the lower cell interconnection electrode 415a and lower peripheral interconnection electrode 415c from the lower core trench insulator 440b and the lower peripheral trench insulator 440c can be relieved. Further, the compressive stresses influencing the lower cell interconnection electrode 415a and the lower peripheral interconnection electrode 415c from the upper core trench insulator 445b and the peripheral trench insulator 445c can be relieved.

In the example embodiment, a cell trench liner 435a, a core trench liner 435b, and a peripheral trench liner 435c may be formed on surfaces of the semiconductor substrate 401 exposed in a cell trench 431a, the core trench 431b, and the peripheral trench 431c. On the other hand, the cell trench liner 435a may be formed between the a cell trench insulator 440a and the surface of the semiconductor substrate 401 exposed in the cell trench 431a, the core trench liner 435b may be formed between the core trench insulator 440b and the surface on the semiconductor substrate 401 exposed in the core trench 431b, and the peripheral trench liner 435c may be formed between the peripheral trench insulator 440c and the surface of the semiconductor substrate 401 exposed in the peripheral trench 431c.

Embodiment 6

Figure 4B:
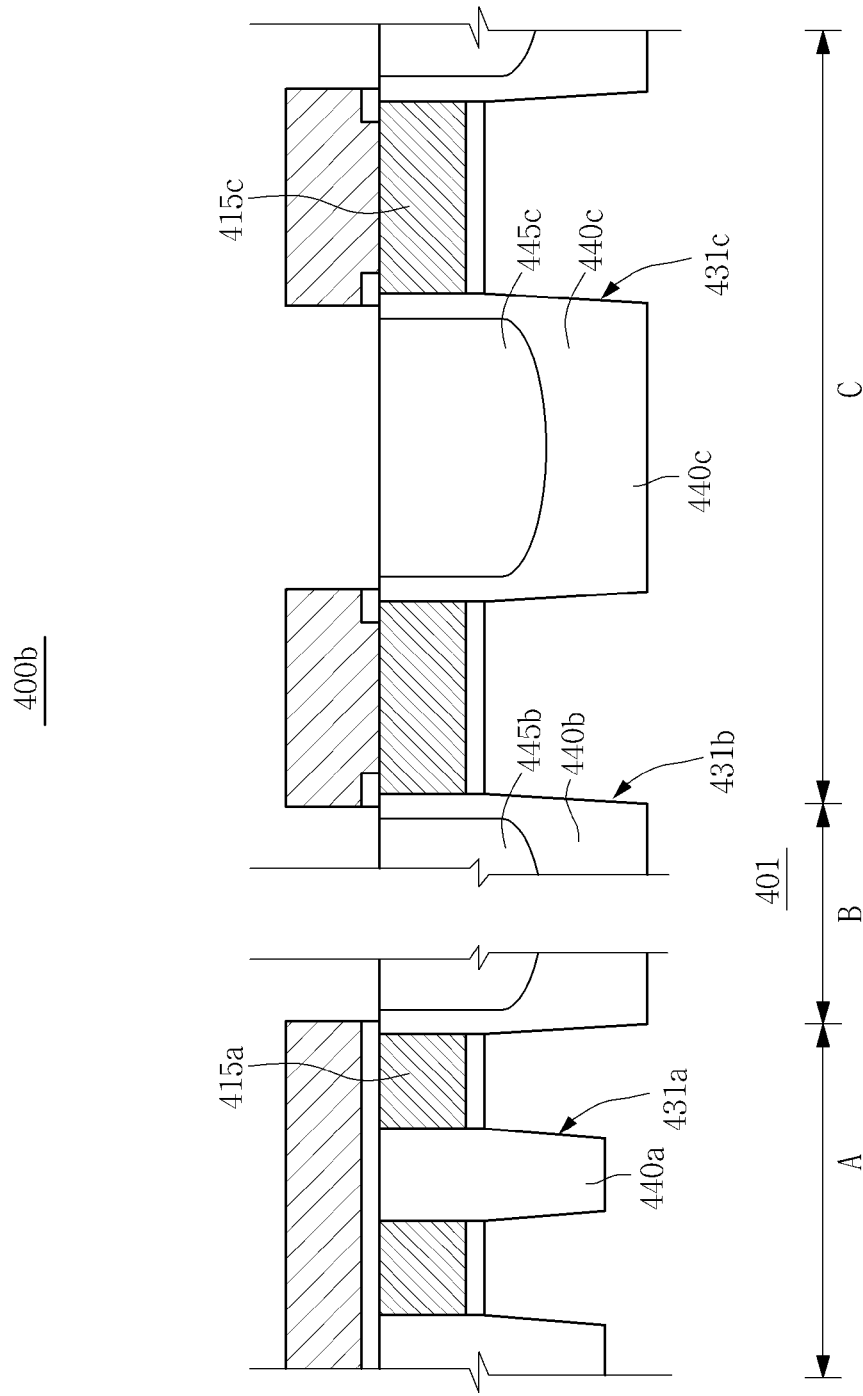

FIG. 4B is a longitudinal cross-sectional view illustrating a semiconductor device 400b in accordance with other example embodiments of the inventive concepts. Referring to FIG. 4B, in comparison with the semiconductor device 400a in FIG. 4A, the semiconductor 400b may not include the trench liners such as the cell trench liner 435a, the core trench liner 435b, and the peripheral trench liner 435c. More detailed descriptions of the semiconductor device 400b are sufficiently understood by referring to the description of the semiconductor device 300b in the FIG. 3B.

Embodiment 7

FIGS. 5A to 5H are longitudinal cross-sectional views schematically illustrating a method of the semiconductor device in accordance with example embodiments of the inventive concepts.

Figure 5A:
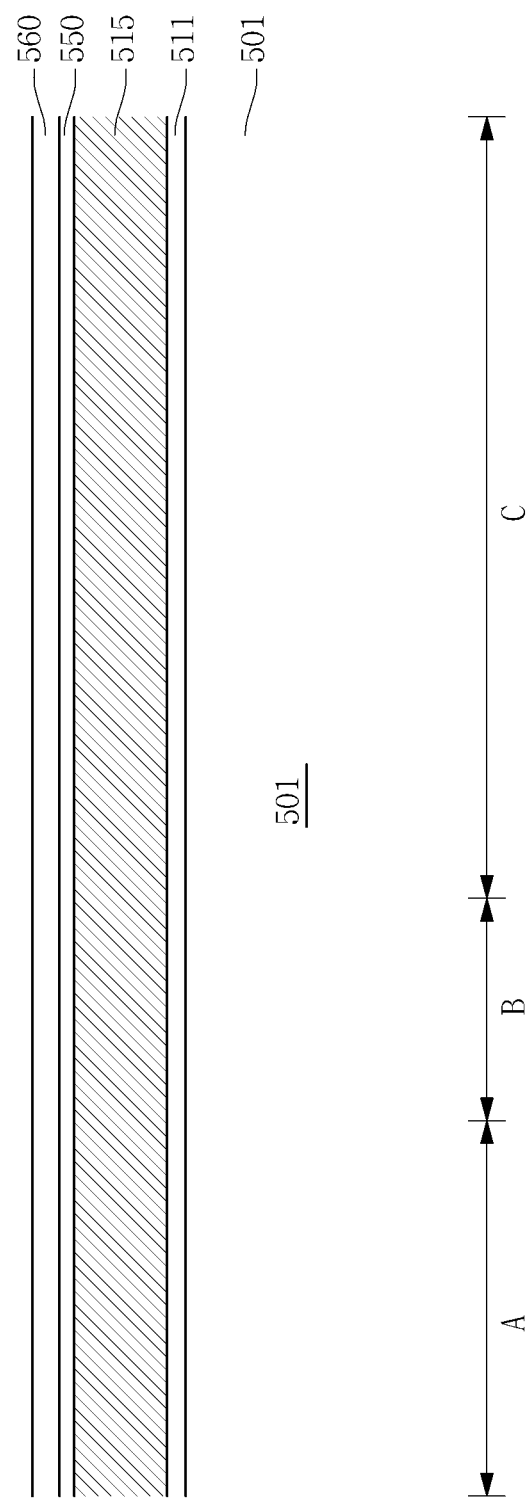
FIGS. 5A to 5H are longitudinal cross-sectional views schematically illustrating a method of the semiconductor device in accordance with example embodiments of the inventive concepts.

Referring to FIG. 5A, a first insulating layer 511, a first conductive layer 515, a buffer layer 550, and a masking layer 560 may be sequentially formed on a surface of a semiconductor substrate 501.

The semiconductor substrate 501 may be a wafer to semiconductor fabrication. For example, the semiconductor substrate 501 may be a single crystalline silicon wafer, an SOI (silicon on insulator) wafer, a compound semiconductor wafer, or a wafer having an epitaxial silicon layer containing carbon C and/or germanium Ge.

The first insulating layer 511 may include silicon oxide, silicon nitride, silicon oxynitride, hafnium oxide, aluminum oxide, tantalum oxide, or other insulating materials. The first insulating layer 511 may be formed of a single layer or multi layers.

The first insulating layer 511 may be formed by oxidizing the surface of the semiconductor substrate 501. On the other hand, the first insulating layer 511 may be formed by depositing silicon oxide directly on the surface of the semiconductor substrate 501.

The first conductive layer 515 may include silicon. Furthermore, for example, the first conductive layer 515 may include at least one of doped silicon, a metal, a metal silicide, a metal compound, a metal alloy, or the other conductor materials. In other example embodiments, the first conductive layer 515 may include a dielectric material having higher permittivity than silicon oxide such as silicon nitride. The first conductive layer 515 may be formed by performing a CVD (chemical vapor deposition) process.

The buffer layer 550 may include at least one of silicon oxide, silicon nitride, silicon oxynitride, hafnium oxide, aluminum oxide, or other insulating materials. The buffer layer 550 may be formed by performing a CVD process.

The masking layer 560 may include silicon nitride or silicon oxynitride. The masking layer 560 may be formed thicker than the buffer layer 550 using a CVD process.

Figure 5B:
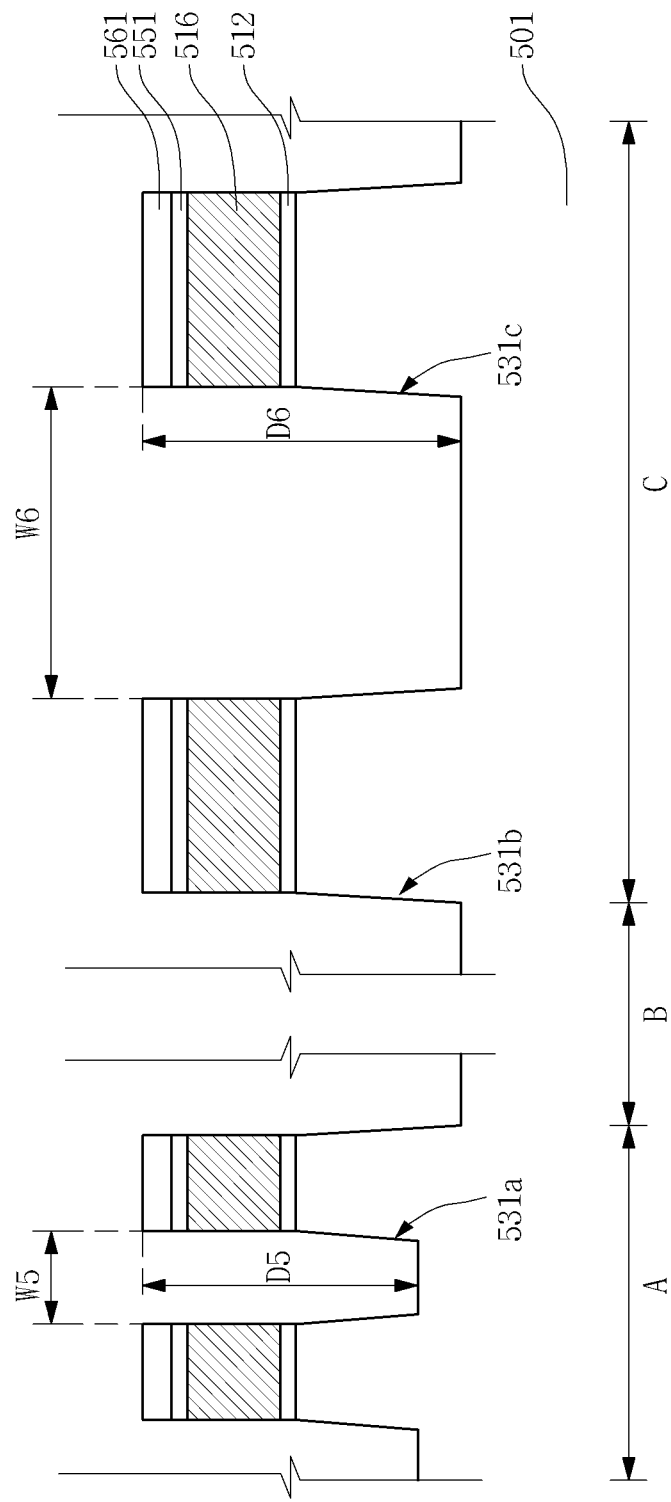

Referring to FIG. 5B, a masking pattern 561, buffer pattern 551, first conductive pattern 516, first insulating pattern 512 and trenches 531a, 531b, and 531c may be formed by performing a photolithography process. Specifically, after forming a photoresist pattern (not shown) on the masking layer 560, the masking pattern 561 may be formed by patterning the masking layer 560 using the photoresist pattern as a patterning mask. Sequentially, the buffer pattern 551, the first conductive pattern 516, the first insulating pattern 512 and the trenches 531, 531b, and 531c may be formed by patterning the buffer layer 550, the first conductive layer 515, the first insulating layer 511, and the semiconductor substrate 501 using the photoresist pattern or the masking pattern 561 as a patterning mask.

The trenches 531a, 531b, and 531c may include a cell trench 531a, a core trench 531b, and a peripheral trench 531c. The cell trench 531a may be formed with a fifth width W5 and a fifth depth D5. The peripheral trench 531c may be formed with a sixth width W6 wider than the fifth width W5 and a sixth depth D6 deeper than the fifth depth D5. The photoresist pattern may be removed. The core trench 531b may be equal in width to or wider than the peripheral trench 531c.

Figure 5C:
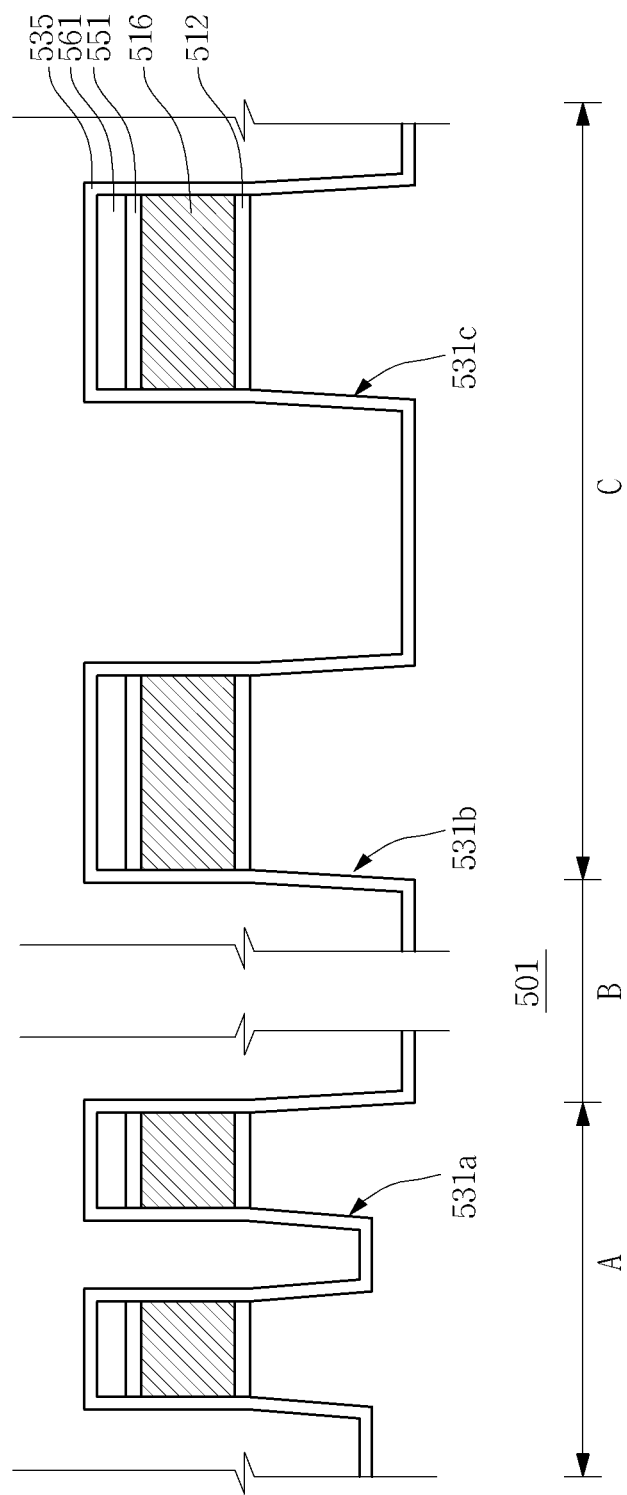

Referring to FIG. 5C, a trench liner layer 535 may be entirely formed. The trench liner layer 535 may include at least one of silicon oxide, silicon nitride, or silicon oxynitride. The trench liner layer 535 may be formed by oxidizing surfaces of the semiconductor substrate 501 exposed in the trenches 531a, 531b, and 531c. Simultaneously, exposed sidewalls of the first insulating pattern 512, the first conductive pattern 516, and/or the buffer pattern 551 may be oxidized and formed into portions of the trench liner layer 535.

When the trench liner layer 535 is formed by performing an oxidation process, the trench liner layer 535 may not be formed on the exposed sidewalls and surfaces of the masking pattern 561.

When the trench liner layer 535 includes silicon nitride or silicon oxynitride, the trench liner layer 535 may be formed by performing a deposition process. When the trench liner layer 535 is formed by performing the deposition process, the trench liner layer 535 may be conformably formed on the exposed sidewalls and surfaces of the masking pattern 561. The trench liner layer 535 may be formed to a thickness of tens of angstroms (Å). In other example embodiments, the trench liner layer 535 may not be formed.

Figure 5D:
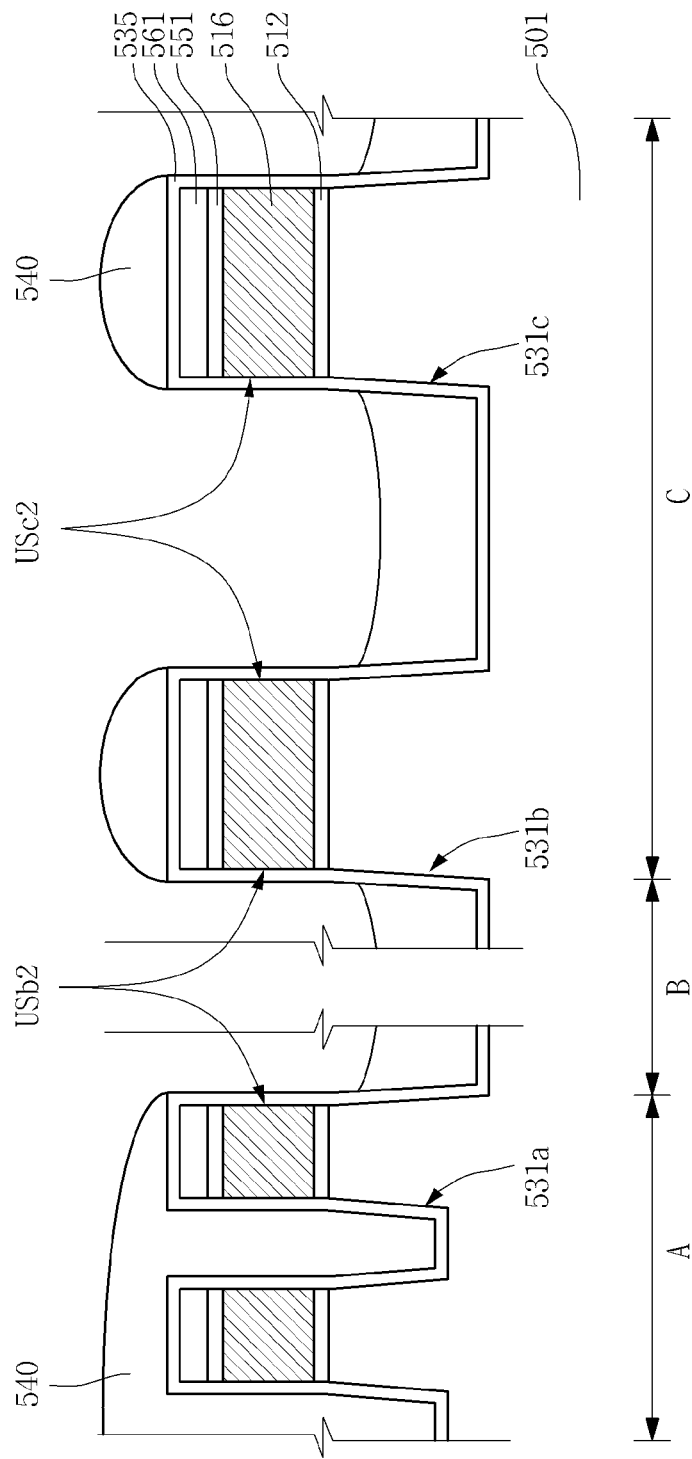

Referring to FIG. 5D, a first trench insulator 540 may be formed. The first trench insulator 540 may completely fill the cell trench 531a. The first trench insulator 540 may fill just the lower portions of the core trench 531b and/or the peripheral trench 531c. Accordingly, the first trench insulator 540 may not be formed on upper sidewalls USb2 of the core trench 531b and upper sidewalls USc2 of the peripheral trench 531c. The first trench insulator 540 may also be formed above the first insulating pattern 512, the first conductive pattern 516, the buffer pattern 551 and the masking pattern 561.

The first trench insulator 540 may include a material having flowability formed by an FCVD (flowable chemical vapor deposition) process. In other words, spin coating processes are excluded among processes for the first trench insulator 540. The first trench insulator 540 may include an organic solution such as solvent. For example, the first trench insulator may include an FCVD oxide. The FCVD oxide may be formed by performing an FCVD process. The FCVD process is distinguished from conventional CVD processes or spin coating processes. In the example embodiment of the inventive concepts, the FCVD process can use a liquid source. Hereinafter, the FCVD process may be described in detail.

The FCVD process may include supplying a silazene precursor, a carrier gas, and an oxidizer into a reaction chamber under a process pressure less than about 1.0 Torr and a process temperature between about 30 to 70° C. More specifically, the process pressure may be between about 0.2 to 0.9 Torr. In an example embodiment, the FCVD process may be performed under process pressure of about 0.8 Torr and process temperature of about 40° C. The silazene precursor may be in a liquid or vapor state including SixHyNz.

The carrier gas may include at least one of inert gases such as helium (H), neon (Ne), argon (Ar), krypton (Kr) and/or xenon (Xe).

The oxidizer may include at least one of ammonia ($NH_3$), nitrogen dioxide ($NO_2$), or ozone ($O_3$). Furthermore, the oxidizer may be excited to an ionized state by plasma.

The carrier gas may be supplied in an amount between 2,000 and 8,000 SCCM (Standard Cubic Centimeter per Minute). In the example embodiment, the carrier gas may be supplied in an amount of about 6,000 SCCM.

The oxidizer may be supplied in an amount between about 200 and about 1,100 SCCM. More specifically, the oxidizer may be respectively supplied through at least two supplying units of the same amount between 100 and 500 SCCM. In the example embodiment, a total of about 850 SCCM of the oxidizer may be respectively supplied through two supplying units in the amount of about 425 SCCM each.

The silazene precursor may be supplied in an amount between about 500 and 2,000 SCCM. In the example embodiment, the silazene precursor may be supplied in an amount of about 1,000 SCCM. In the experiment, the foregoing process circumstances would be the optimized process to form a profile of the first trench insulator 540 shown in FIG. 5D.

The profile of the first trench insulator 540 may be made by performing a densification process. The densification process may include annealing the first trench insulator 540 in an environment with hydrogen and/or oxygen under a process pressure between about 0.1 and 10 Torr and a process temperature between 30 and 250° C. After performing the densification process, the volume of the first trench insulator 540 may be reduced. Thus, the profile of the first trench insulator 540 in FIG. 5D may be a reduced volume profile.

Figure 5E:
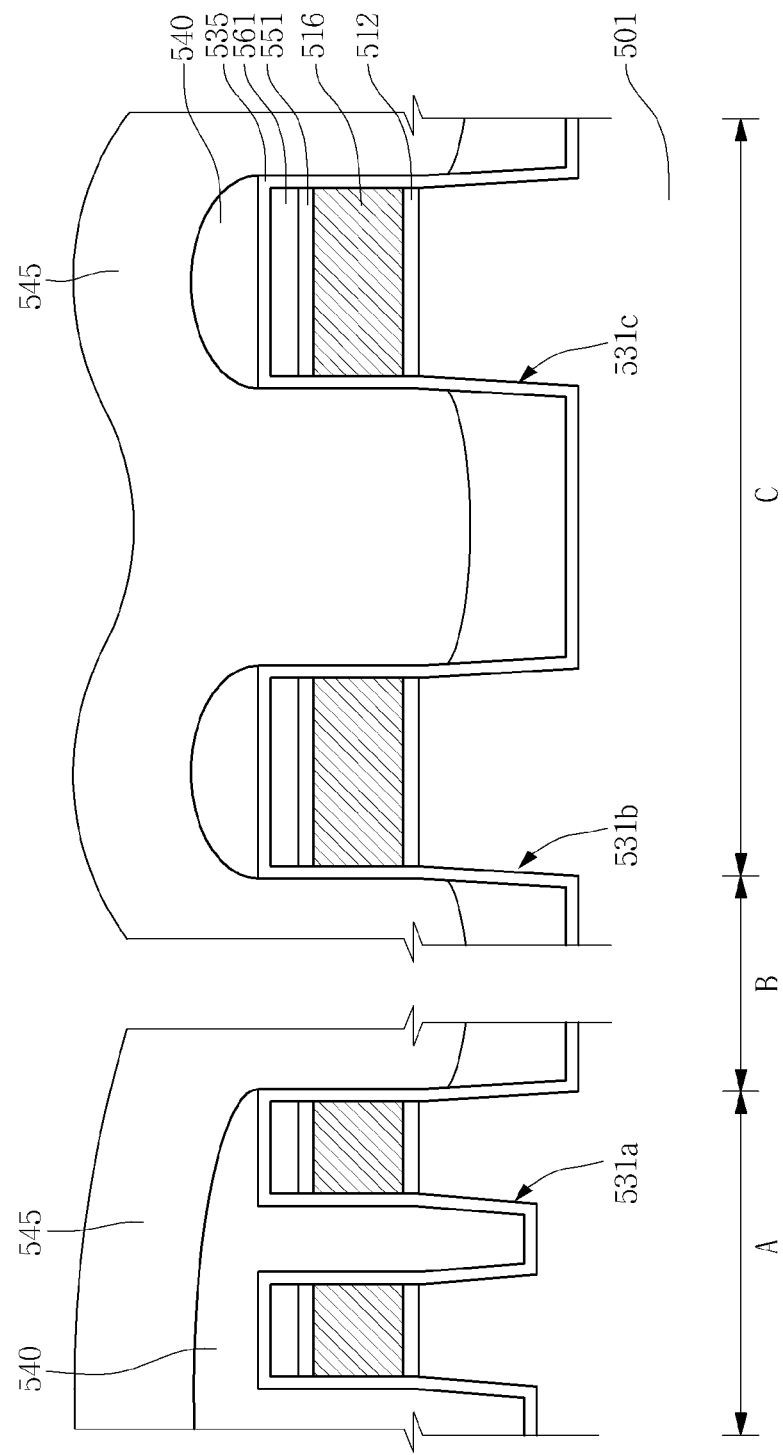

Referring to FIG. 5E, a second trench insulator 545 may be entirely formed. The second trench insulator 545 may be formed on the first trench insulator to a sufficient thickness to completely fill the core trench 531b and the peripheral trench 531c. The second trench insulator 545 may include MTO, HDP oxide, or USG. The second trench insulator 545 may be formed by performing a coating process or a deposition process.

Figure 5F:
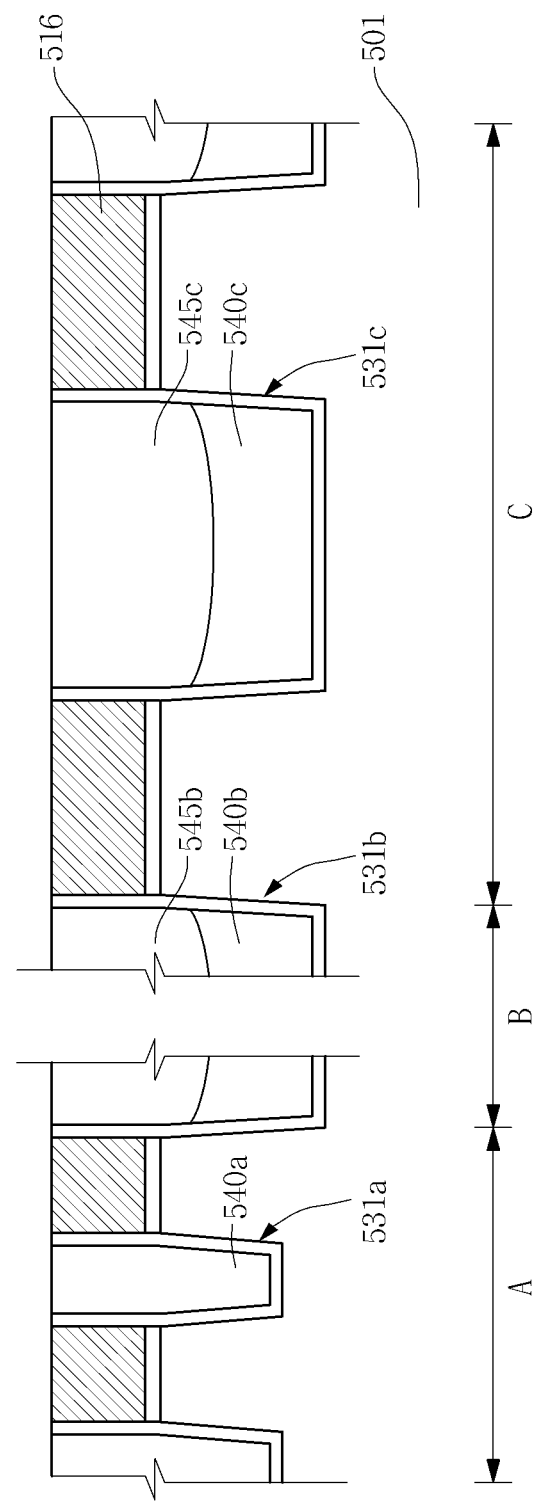

Referring to FIG. 5F, a planarizing process e.g., a CMP (chemical mechanical polishing) process or an etch-back process, may be performed to expose a top surface of the first conductive pattern 516. In other example embodiments, the planarizing process may be performed to keep a portion of the buffer pattern 551 on the first conductive pattern. For convenience of description, the top surface of the first conductive pattern 516 is exposed in the drawing. Accordingly, the cell trench 531a may be filled with a cell trench insulator 540a, the core trench 531b may be filled with a lower core trench insulator 540b and an upper core trench insulator 545b, and the peripheral trench 531c may be filled with a lower peripheral trench insulator 540c and an upper peripheral trench insulator 545c.

Figure 5G:
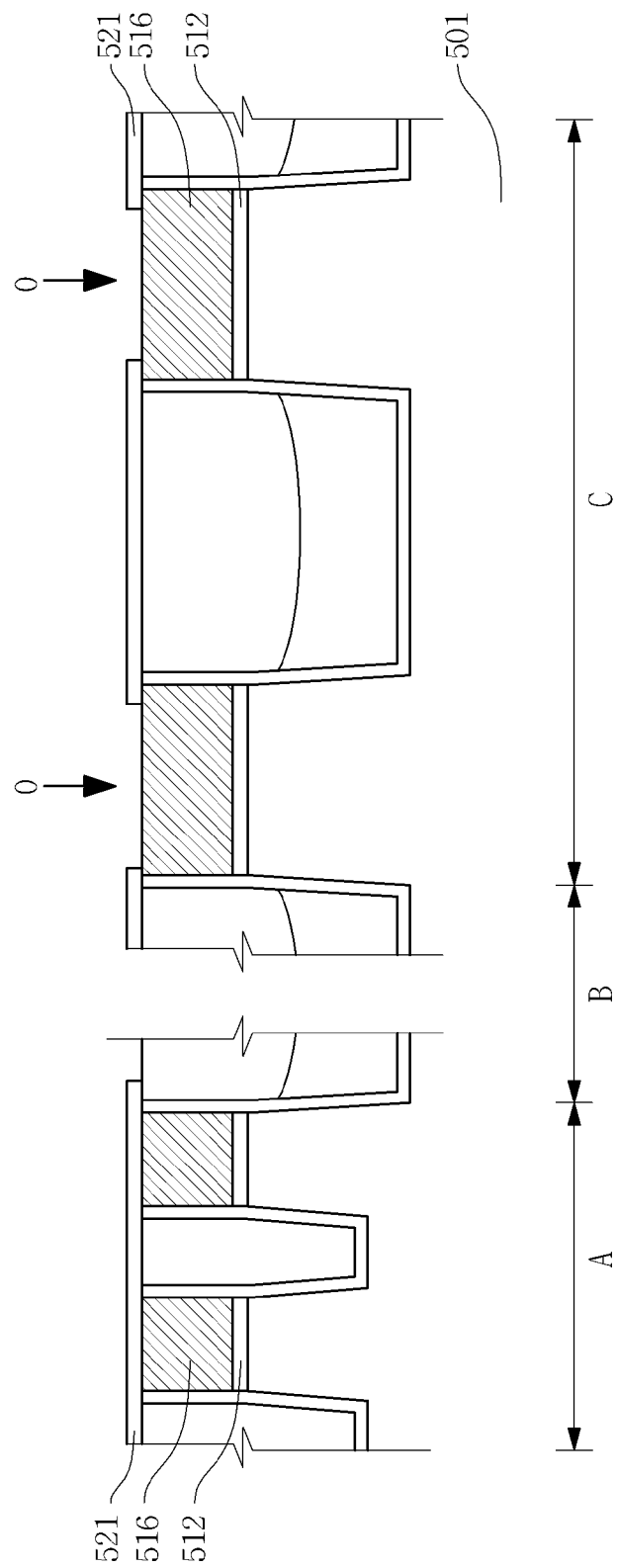

Referring to FIG. 5G, a second insulating pattern 521 may be formed. The second insulating pattern 521 may include openings O exposing a portion of the top surface of the first conductive pattern 516 located in peripheral circuit area C. The second insulating pattern 521 may not expose a top surface of the first conductive pattern 516 located in cell area A. The second insulating pattern 521 may include at least one of silicon oxide, silicon nitride, silicon oxynitride, hafnium oxide, aluminum oxide, tantalum oxide, or other insulating materials. The second insulating pattern 521 may be formed by performing a CVD process and a photolithography process.

Figure 5H:
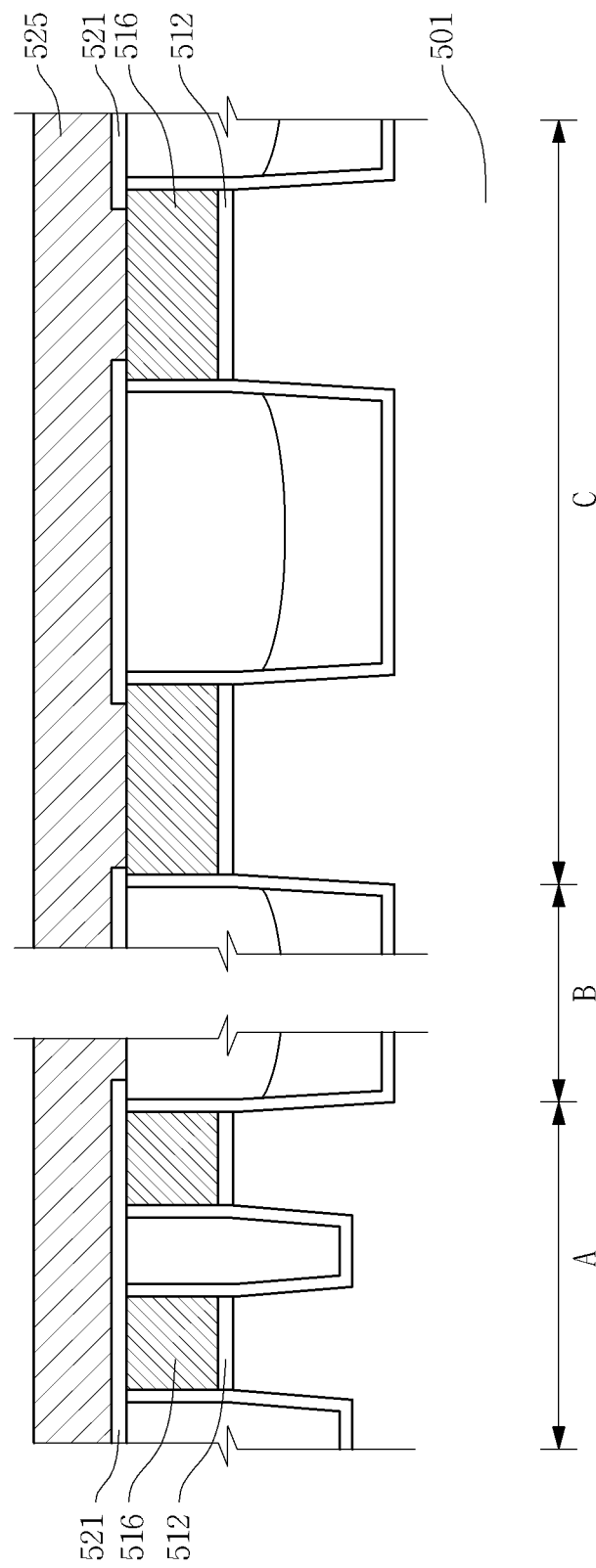

Referring to FIG. 5H, a second conductive layer 525 may be entirely formed. The second conductive layer 525 may include at least one of silicon, a metal, a metal silicide, a metal compound, a metal alloy, or other conductive materials. The second conductive layer 525 may be electrically and/or physically connected to and/or in contact with the exposed top surfaces of the first conductive pattern. The second conductive layer 525 may be formed by performing CVD, PVD, or plating processes.

The upper cell interconnection pattern 320a and the upper peripheral interconnection pattern 320c in FIG. 3A may be formed by patterning the second conductive layer 525 and the second insulating pattern 521. Simultaneously, the first conductive pattern 516 may be formed into the lower cell interconnection electrode 315a and the lower peripheral interconnection electrode 315c in FIG. 3A. The first insulating pattern 512 may be formed into the lower cell interconnection insulating layer 310a and the lower peripheral interconnection insulating layer 310c in FIG. 3A.

Embodiment 8

Figure 6:
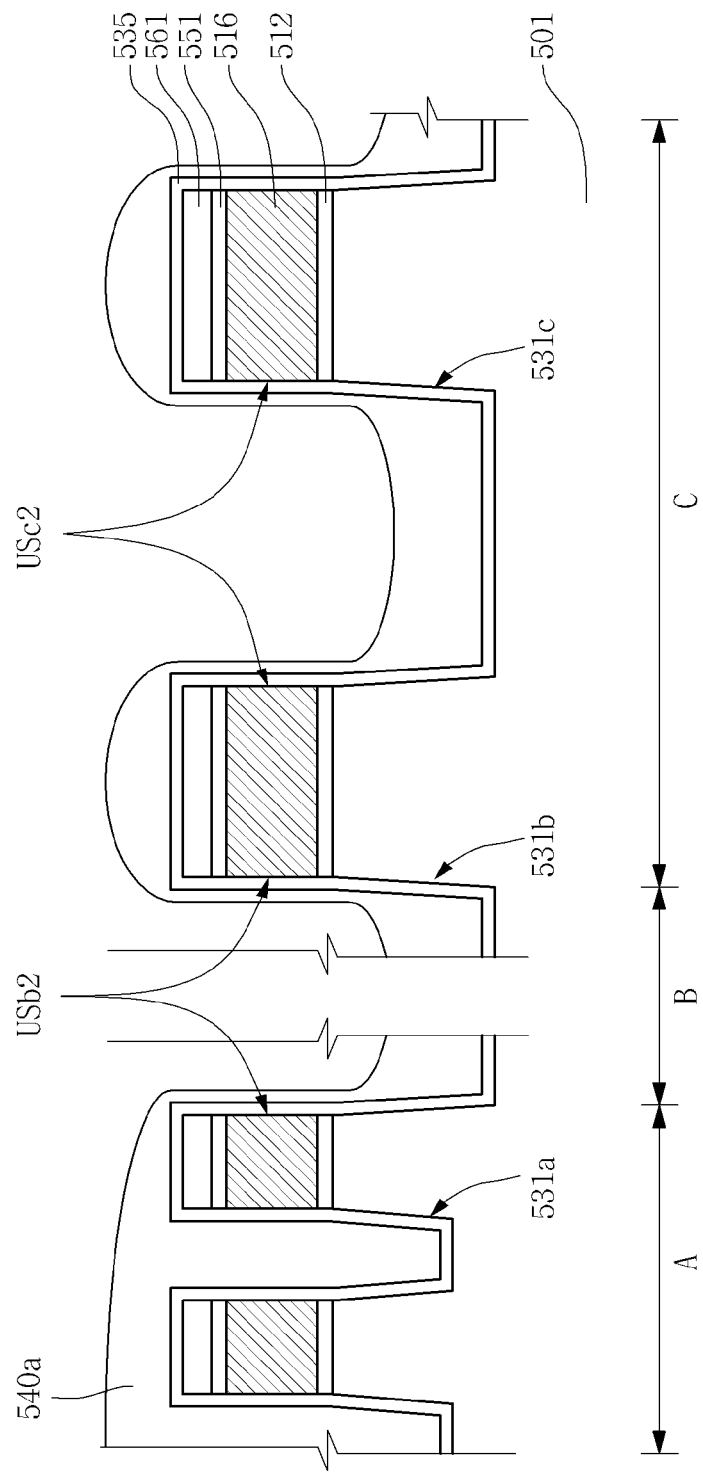
FIG. 6 is a longitudinal cross-sectional view schematically illustrating one of the steps of a method of fabricating a semiconductor device in accordance with example embodiments of the inventive concepts.

FIG. 6 is a longitudinal cross-sectional view schematically illustrating one of the steps of a method of fabricating the semiconductor device in accordance with other example embodiment of the inventive concepts. Referring to FIG. 6, in comparison with FIG. 5D, the trench insulator 540a may also be formed on the upper sidewalls USb2 and USc2 of the core trench 531b and the peripheral trench 531c. The profile of the trench insulator 540a may be formed by reducing the supplying amount of the carrier gas to less than about 5,000 SCCM, increasing the supplying amount of the oxidizer to greater than about 1,000 SCCM, or reducing the supplying amount of the silazene precursor to less than about 800 SCCM during the process of forming the profile of the trench insulator 540 in FIG. 5D.

Embodiment 9

Figure 7A:
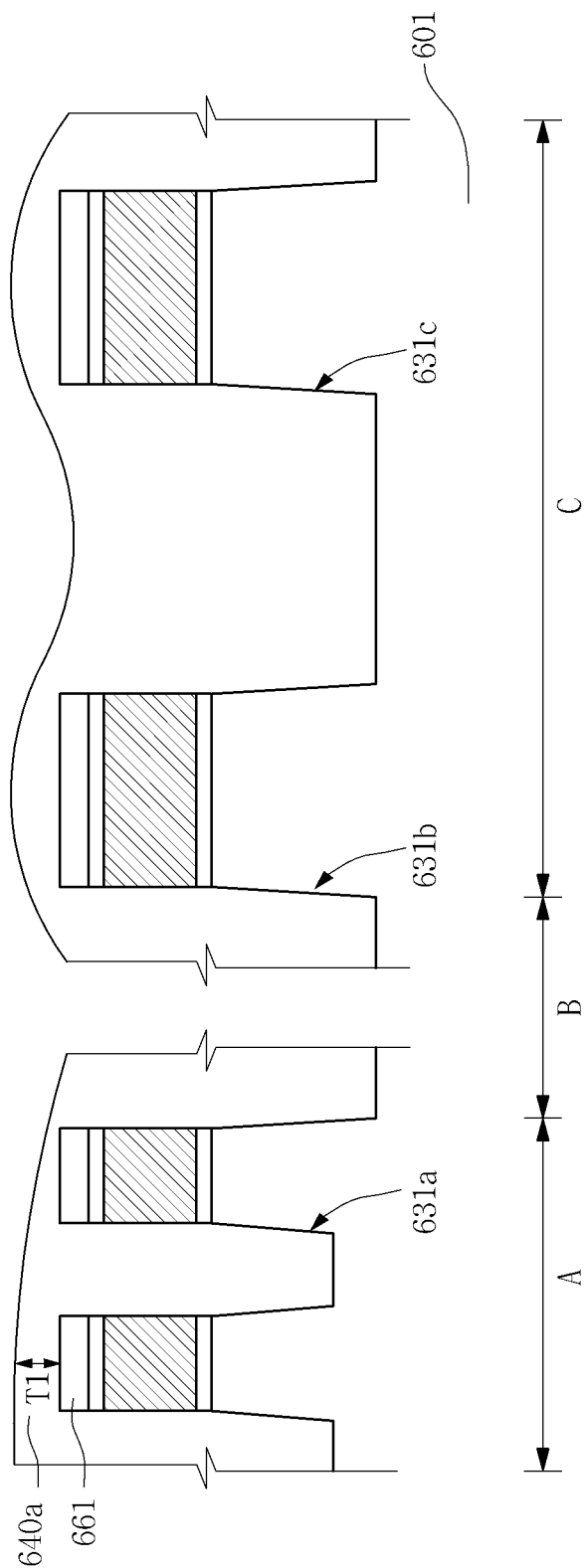
FIGS. 7A to 7C are longitudinal cross-sectional views schematically illustrating semiconductor devices having trench insulators deposited by various process conditions in accordance with example embodiments of the inventive concepts.
Figure 7B:
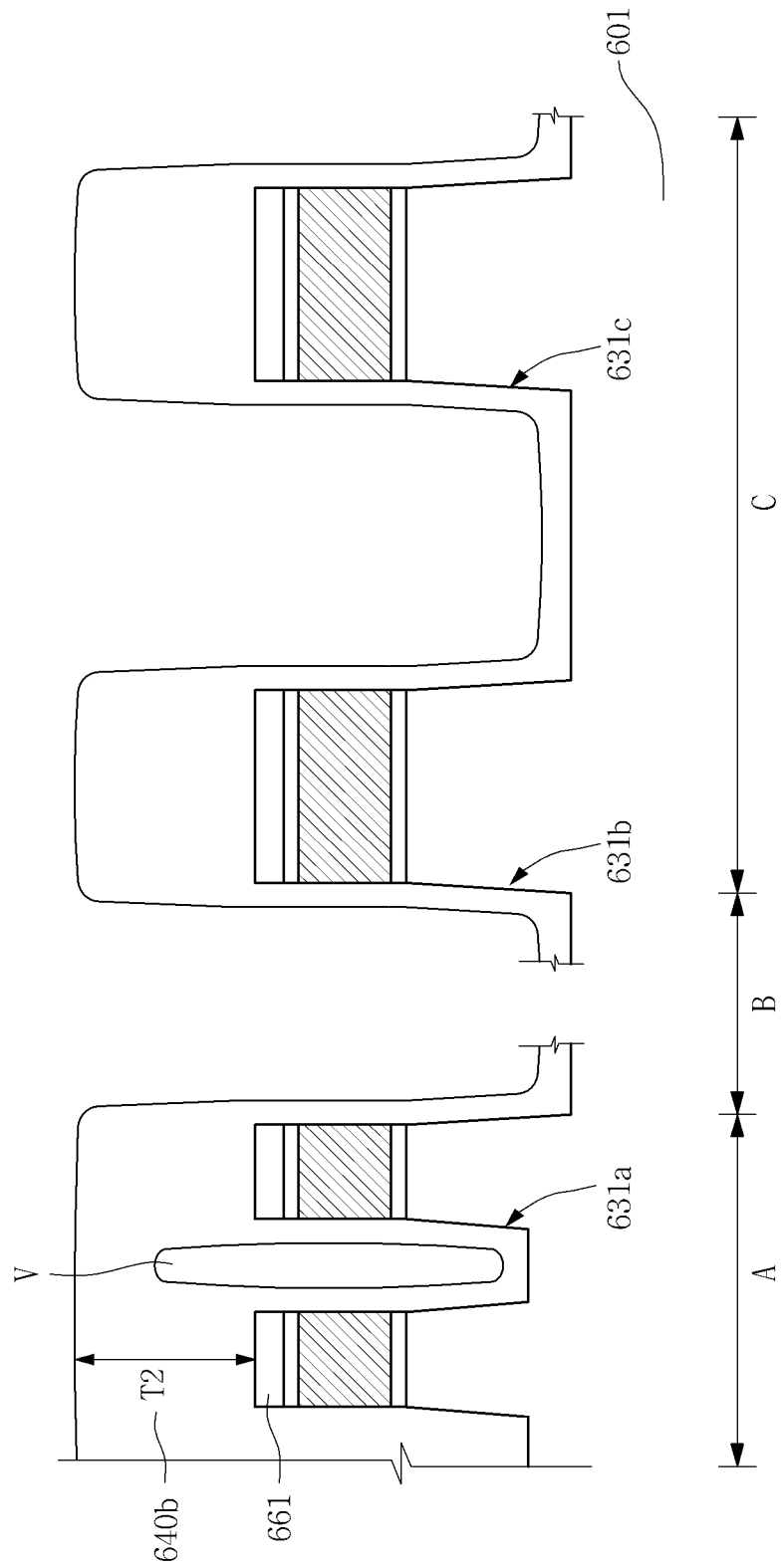
Figure 7C:
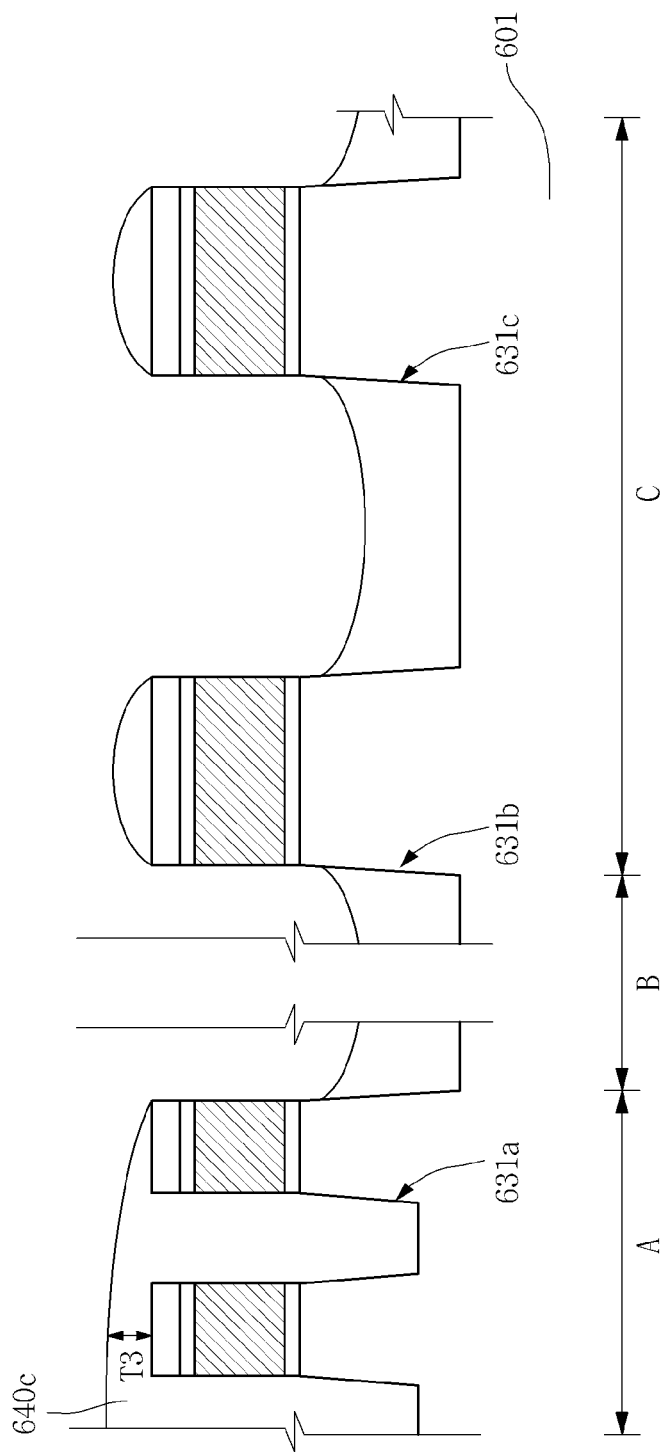

FIGS. 7A to 7C are longitudinal cross-sectional views schematically illustrating a semiconductor device having trench insulating materials deposited by various process conditions in accordance with example embodiments of the inventive concepts. FIGS. 7A to 7C illustrate profiles of the trench insulators 640a, 640b, and 640c formed by various process conditions to be easily understood in accordance with the inventive concepts. Referring to FIGS. 7A to 7C, the semiconductor substrate 601 may include a cell area A, a core area B, and a peripheral circuit area C. A first trench 631a corresponding to a cell trench may be formed in the cell area A, a second trench 631b corresponding to a core trench may be formed in the core area B, and the third trench 631c corresponding to a peripheral trench may be formed in the peripheral circuit area C. A cell structure 661 may be formed in the cell area A. In FIGS. 7A to 7C, trench liners may be omitted in the trenches 631a, 631b, and 631c to show the inventive concepts being variously applied.

Referring to FIG. 7A, the trench insulator 640a formed by a first process condition of the inventive concepts may be formed to completely fill the first trench 631, the second trench 631b, and the third trench 631c. The first trench insulator 640a may be formed as a first thickness T1 above the cell structure 661 in the cell area A. The first process may include supplying a carrier gas of about 8,000 SCCM, an oxidizer of about 1,100 SCCM, and a silazene precursor of 1,300 SCCM in a reaction chamber under a pressure at 0.85 Torr and a temperature of 40° C. The oxidizer may be supplied in individual amounts of about 550 SCCM through two supplying units, respectively.

Referring to FIG. 7B, the trench insulator 640b formed by a second process condition of the inventive concepts may be formed to completely fill the first trench 631a and conformably formed on bottom surfaces and sidewalls of the second trench 631b and the third trench 631c. A void V may be formed in the first trench 631a. The trench insulator 640b may be formed as a second thickness T2 thicker than the first thickness T1 on the cell structure 661 in the cell area A as illustrated in FIG. 7A. The second process may include supplying a carrier gas of about 2000 SCCM, an oxidizer of about 1600 SCCM, and a silazene precursor of 550 SCCM in a reaction chamber under pressure at 0.80 Torr and temperature of 40° C. The oxidizer may be supplied in individual amounts of about 800 SCCM through two supplying units, respectively.

Referring to FIG. 7C, the trench insulator 640c formed by a third process condition of the inventive concepts may be formed to completely fill the first trench 631a and to medially fill the second trench 631b and the third trench 631c. The trench insulator 640c may be formed as a third thickness T3 thicker than the first thickness T1 of FIG. 7A and thinner than the second thickness T2 on the cell structure 661 in the cell area A as illustrated in FIG. 7B. The third process may include supplying a carrier gas of about 6,000 SCCM, an oxidizer of about 850 SCCM, and a silazene precursor of about 1,000 SCCM in a reaction chamber under a pressure at 0.85 Torr and a temperature of 40° C. The oxidizer may be supplied as individual amounts of about 425 SCCM through two supplying units, respectively. On the other hand, the third process may include supplying a carrier gas of about 5,000 SCCM, an oxidizer of about 1,100 SCCM, and a silazene precursor of 550 SCCM in a reaction chamber under a pressure at 0.9 Torr and a temperature of 50° C.

In any of the processes, the oxidizer may include at least one of ammonia ($NH_3$), nitrogen dioxide ($NO_2$), or ozone ($O_3$). In the example embodiments, the oxidizer may include at least ammonia. In any of the processes, the supplying amount of the oxidizer may be greater than the amount of the silazene precursor but not exceed three times the amount. Specifically, the amount of the oxidizer may be one and a half to two and a half times less than the amount of the silazene precursor. In the example embodiments, the amount of the oxidizer is about double the amount of the silazene precursor.

According to experimental results referring to FIGS. 7A to 7C, when the supplying amount of the carrier gas increases, the trench insulator 640a may be more easily formed to completely fill the second trench 631b and the third trench 631c. Otherwise, when the supplying amount of the carrier gas decreases, the trench insulator 640b may be more easily and conformably formed on the sidewalls of the second trench 631b and the third trench 631c. Accordingly, to achieve the inventive concepts, the proper supplying amount of the carrier gas may be requested.

Embodiment 10

FIGS. 8A to 8D are block diagrams of a semiconductor module, an electronic circuit board, a data storage device and an electronic system respectively having a semiconductor device in accordance with example embodiments of the inventive concepts.

Figure 8A:
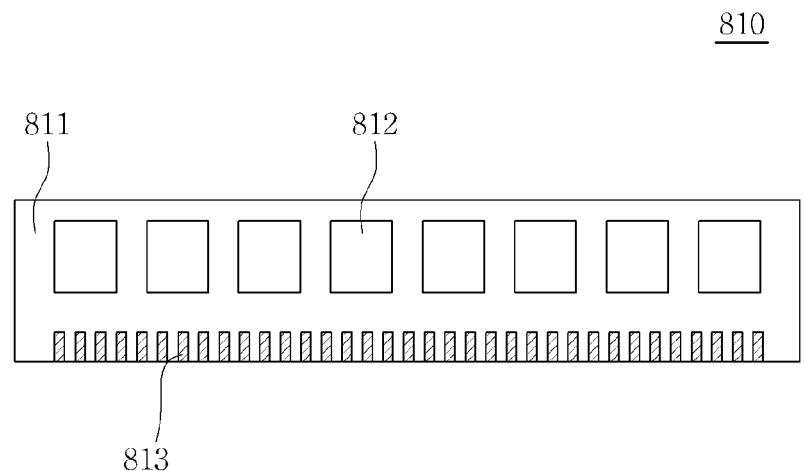
FIGS. 8A to 8D are schematic views or block diagrams of a semiconductor module, an electronic circuit board, a data storage device and an electronic system respectively having a semiconductor device in accordance with example embodiments of the inventive concepts.

FIG. 8A is a schematic view of a semiconductor module including a semiconductor device in accordance with an example embodiment. Referring to FIG. 8A, a semiconductor module 810, in which semiconductor devices in accordance with an example embodiment are mounted, includes a module board 811, a plurality of semiconductor devices 812 disposed on the module board 811, and module contact terminals 813 formed in parallel on one edge of the module board 811 and electrically connected to the semiconductor devices 812. The module board 811 may be a printed circuit board (PCB). Both surfaces of the module board 811 may be used. That is, the semiconductor devices 812 may be disposed on front and rear surfaces of the module board 811.

While FIG. 8A illustrates eight semiconductor devices 812 disposed on the front surface of the module board 811, it has been shown for illustrative purposes only. In addition, a separate controller or chip sets may be further provided to control semiconductor devices 812 or semiconductor packages. Therefore, the number of semiconductor devices 812 shown in FIG. 8A is not necessarily provided to a single semiconductor module 810. At least one of the semiconductor devices 812 may include one of the semiconductor devices 100, 200, 300a, 300b, 400a, and 400b in accordance with an example embodiment. The module contact terminals 813 may be formed of a metal and have oxidation resistance. The module contact terminals 813 may be variously set according to standards of the semiconductor module 810. For this reason, the number of the module contact terminals 813 may vary.

Embodiment 11

Figure 8B:
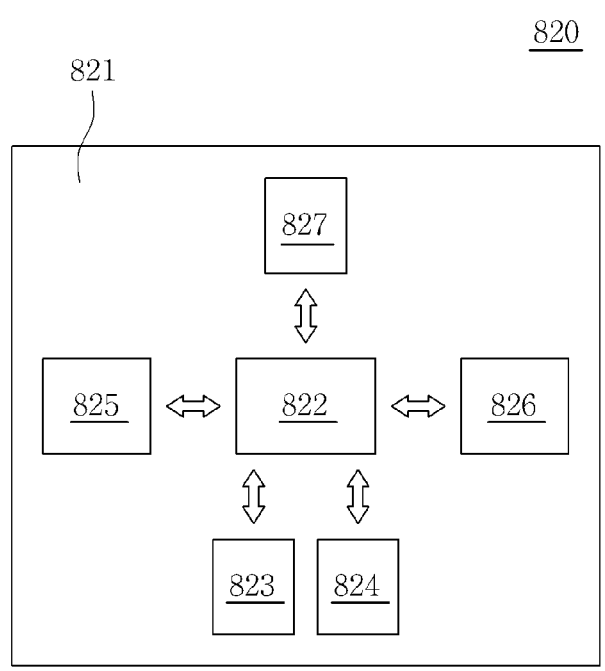

FIG. 8B is a block diagram of an electronic circuit board including a semiconductor device in accordance with an example embodiment. Referring to FIG. 8B, an electronic circuit board 820 in accordance with an example embodiment includes a microprocessor 822, a main storage circuit 823 and a supplementary storage circuit 824 in communication with the microprocessor 822, an input signal processing circuit 825 for sending a command to the microprocessor 822, an output signal processing circuit 826 for receiving a command from the microprocessor 822, and a communicating signal processing circuit 827 for sending/receiving an electric signal to/from another circuit board, disposed on a circuit board 821.

Arrows can be understood to show paths to transmit electric signals. The microprocessor 822 may receive and process various electric signals, output the processed results, and control other components of the electronic circuit board 821. The microprocessor 822 may be, for example, a central processing unit (CPU) and/or a main control unit (MCU). The main storage circuit 823 may temporarily store data that is frequently required by the microprocessor 822 or data before and after processing. Since the main storage circuit 823 needs a rapid response speed, the main storage circuit 823 may be constituted by a semiconductor memory. More specifically, the main storage circuit 823 may be a semiconductor memory, such as a cache memory, or may be constituted by a static random access memory (SRAM), a dynamic random access memory (DRAM), a resistive random access memory (RRAM), and their applied semiconductor memories, for example, a utilized RAM, a ferro-electric RAM, a fast cycle RAM, a phase changeable RAM, and other semiconductor memories.

In addition, the main storage circuit 823 may include a volatility or non-volatility RAM. In this example embodiment, the main storage circuit 823 may include at least one of the semiconductor devices 100, 200, 300a, 300b, 400a, and 400b in accordance with an example embodiment, or at least one semiconductor module including one or more of the semiconductor devices 100, 200, 300a, 300b, 400a, and 400b. The supplementary storage circuit 824 may be a large capacity storage device, which may be a non-volatile semiconductor memory such as a flash memory, a hard disc drive using a magnetic field, or a compact disc drive using light. The supplementary storage circuit 824 may be used when a large amount of data is to be stored, not requiring a rapid response speed as compared with the main storage circuit. The supplementary storage circuit 824 may include a non-volatile storage device. The supplementary storage circuit 824 may include at least one of the semiconductor devices 100, 200, 300a, 300b, 400a, and 400b in accordance with an example embodiment, or a semiconductor module 810 including one or more of the semiconductor devices 100, 200, 300a, 300b, 400a, and 400b. The input signal processing circuit 825 may convert an external command into an electric signal, or transmit the electric signal transmitted from the exterior to the microprocessor 822.

The command or the electric signal transmitted from the exterior may be an operation command, an electric signal to be processed, or data to be stored. The input signal processing circuit 825 may be a terminal signal processing circuit for processing a signal transmitted from, for example, a keyboard, a mouse, a touch pad, an image recognition device or various sensors. The input signal processing circuit 825 may be an image signal processing circuit for processing an image signal input from a scanner or a camera, or various sensors or input signal interfaces. The input signal processing circuit 825 may include at least one semiconductor device in accordance with an example embodiment, or at least one semiconductor module 810 including the semiconductor device. The output signal processing circuit 826 may be a component for transmitting an electric signal processed through the microprocessor 822 to the exterior.

For example, the output signal processing circuit 826 may be a graphics card, an image processor, an optical converter, a beam panel card, or interface circuits having various functions. The output signal processing circuit 826 may include at least one of the semiconductor devices 100, 200, 300a, 300b, 400a, and 400b in accordance with an example embodiment, or at least one semiconductor module 810 including one or more of the semiconductor devices 100, 200, 300a, 300b, 400a, and 400b. The communication circuit 827 is a component for directly sending/receiving an electric signal to/from another electronic system or another circuit board, not through the input signal processing circuit 825 or the output signal processing circuit 826. For example, the communication circuit 827 may be a modem, a LAN card, or various interface circuits of a personal computer system. The communication circuit 827 may include at least one of the semiconductor devices 100, 200, 300a, 300b, 400a, and 400b in accordance with an example embodiment, or at least one semiconductor module 810 including one or more of the semiconductor devices 100, 200, 300a, 300b, 400a, and 400b.

Embodiment 12

Figure 8C:
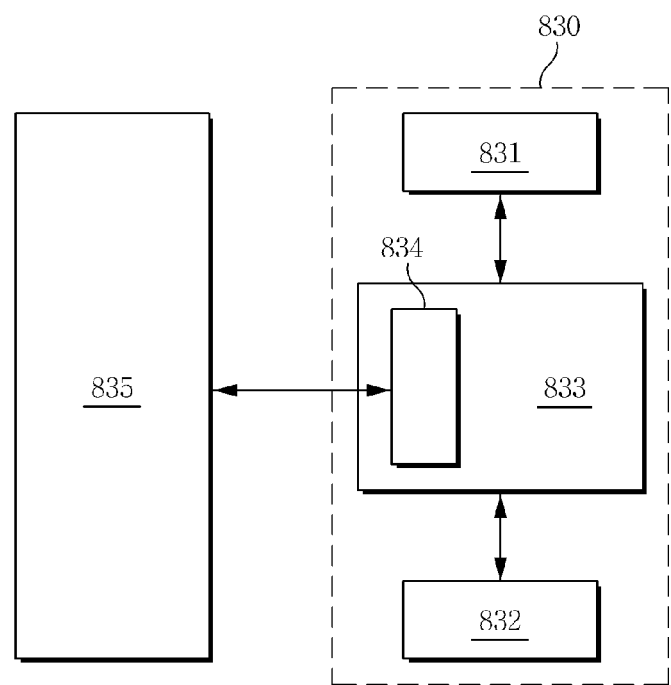

FIG. 8C, is a block diagram of a data storage device including a semiconductor device in accordance with an example embodiment. Referring to FIG. 8C, a data storage device in accordance with an example embodiment includes a host 835 and a SSD (solid state disk) 830. The SSD 830 may be a data storage device to store information using semiconductor devices. The SSD 830 can operate faster and has less mechanical delay, failure rates, heat budget, and noise than hard disk drivers (HDDs). Furthermore, the SSD 830 has the advantage of being lighter and more compact. The SSD 830 may be applied in portable computers, desktop computers, MP3 players, mobile smart phones, or other portable storage devices.

The SSD 830 may include a non-volatile memory 831, a buffer memory 832, and a controller 833. The non-volatile memory 831 may be any one of the semiconductor devices 100, 200, 300a, 300b, 400a, and 400b according to the exemplary embodiments of the inventive concepts. The non-volatile memory (831) may be a resistive memory. The non-volatile memory 831 may include a data storage element including at least one of a phase change material pattern, a magnetic tunnel junction (MTJ) pattern, a polymer pattern, and an oxide pattern. The buffer memory 832 may include a volatile memory. The volatile memory may include DRAM or SRAM. The buffer memory 832 can operate faster than the non-volatile memory 831. The controller 833 may further include an interface 834 connected to the host 835. The interface 834 may be in contact with the host 835 to transmit and receive electrical signals such as data. The interface 834 may be a device using one standard of SATA, IDE, or SCSI.

The data processing rate of the interface 834 may be higher than the operating speed of the non-volatile memory 831. The buffer memory 832 may serve to temporarily store data. The data received by the interface 834 may be temporarily stored in the buffer memory 832 via the controller 833, and permanently stored in the non-volatile memory 831 at a data writing speed of the non-volatile memory 831. Furthermore, frequently-used data of the data stored in the non-volatile memory 831 may be temporarily stored in the buffer memory 832 through pre-reading. In other words, the buffer memory 832 may serve to increase efficient operating speed and reduce the error rate of the SSD 830.

The controller 833 may include a memory controller (not shown) and a buffer controller (not shown). The non-volatile memory 831 may be disposed adjacent to and in electrical contact with the controller 833. The data storage capacity of the SSD 830 may correspond to that of the non-volatile memory 831. The buffer memory 832 may be disposed adjacent to and in electrical contact with the controller 833. The non-volatile memory 831 may be in contact with the interface 834 via the controller 833. The non-volatile memory 831 may serve to store the data received by the interface 834. Although power supplied to the SSD 830 is interrupted, the data stored in the non-volatile memory 831 may be conserved.

Embodiment 13

Figure 8D:
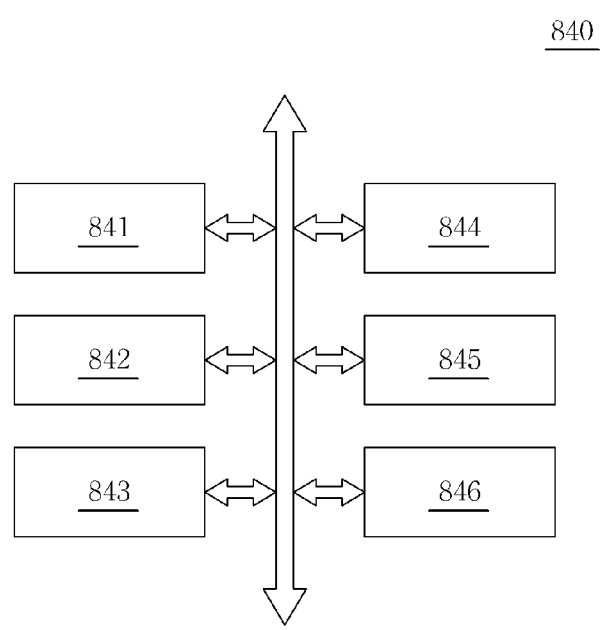

FIG. 8D is a block diagram of an electronic system including semiconductor devices or a semiconductor module including at least semiconductor device in accordance with an example embodiment. Referring to FIG. 8D, an electronic system 840 in accordance with an example embodiment includes a control unit 841, an input unit 842, an output unit 843, and a storage unit 844, and may further include a communication unit 845 and an operation unit 846. The control unit 841 can generally control the electronic system 840 and the respective units. The control unit 841 may be a central processing unit or a central control unit, and may include the electronic circuit board 820 in accordance with an example embodiment.

In addition, the control unit 841 may include at least one of the semiconductor devices 100, 200, 300a, 300b, 400a, and 400b, or at least one semiconductor module 810 including one or more of the semiconductor devices 100, 200, 300a, 300b, 400a, and 400b in accordance with the inventive concepts. The input unit 842 can send an electric command signal to the control unit 841. The input unit 842 may be a keyboard, a key pad, a mouse, a touch pad, an image recognition device such as a scanner, or various input sensors. The input unit 842 may include at least one of the semiconductor devices 100, 200, 300a, 300b, 400a, and 400b, or at least one semiconductor module 810 including one or more of the semiconductor devices 100, 200, 300a, 300b, 400a, and 400b in accordance with the inventive concepts.

The output unit 843 may receive an electric command signal from the control unit 841 and output the results processed by the electronic system 840. The output unit 843 may be a monitor, a printer, a beam projector, or various mechanical devices. The output unit 843 may include at least one of the semiconductor devices 100, 200, 300a, 300b, 400a, and 400b, or at least one semiconductor module 810 including one or more of the semiconductor devices 100, 200, 300a, 300b, 400a, and 400b in accordance with the inventive concepts. The storage unit 844 may be a component for temporarily or permanently storing an electric signal to be processed or already processed by the controller 841. The storage unit 844 may be physically or electrically connected or coupled with the control unit 841.

The storage unit 844 may be a semiconductor memory, a magnetic storage device such as a hard disc, an optical storage device such as a compact disc, or other servers having data storage functions. In addition, the storage unit 844 may include at least one of the semiconductor devices 100, 200, 300a, 300b, 400a, and 400b, or at least one semiconductor module 810 including one or more of the semiconductor devices 100, 200, 300a, 300b, 400a, and 400b in accordance with the inventive concepts. The communication unit 845 may receive an electric command signal from the control unit 841 and send/receive an electric signal to/from another electronic system. The communication unit 845 may be a wired sending/receiving device such as a modem or a LAN card, a wireless sending/receiving device such as a WIBRO interface, an infrared port, etc.

In addition, the communication unit 845 may include at least one of the semiconductor devices 100, 200, 300a, 300b, 400a, and 400b, or at least one semiconductor module 810 including one or more of the semiconductor devices 100, 200, 300a, 300b, 400a, and 400b in accordance with the inventive concepts. The operation unit 846 may be physically or mechanically operated according to a command of the control unit 841. For example, the operation unit 846 may be a mechanically operated component such as a plotter, an indicator, an up/down operator, etc. The electronic system in accordance with an example embodiment may be a computer, a network server, a network printer or scanner, a wired controller, a mobile communication terminal, an exchanger, or other electronic system operated by programs.

What is claimed is:

1. A method of fabricating a semiconductor device comprising:

forming a first trench and a second trench in a semiconductor substrate;

forming a first insulator to completely fill the first trench, the first insulator covering a bottom surface and lower sidewalls of the second trench and exposing upper sidewalls of the second trench; and forming a second insulator on the first insulator in the second trench;

wherein the forming the first insulator includes supplying a carrier gas between about 2,000 and 8,000 SCCM, an oxidizer between about 200 and 1,100 SCCM, and a silazene precursor between about 500 and 2,000 SCCM into a reaction chamber under a pressure less than about 1.0 Torr and a temperature between about 30 and 70° C.;

wherein the forming the first trench and the second trench comprises:

forming the first trench having a first width and a first depth; and forming the second trench having a second width greater than the first width and a second depth deeper than the first depth.

2. The method according to claim 1, wherein the forming the first insulator includes forming a tensile stressing material.

3. The method according to claim 2, wherein the forming the first insulator includes forming silazene oxide.

4. The method according to claim 1, wherein the supplying the carrier gas includes supplying argon (Ar) gas between about 5,000 and 6,000 SCCM.

5. The method according to claim 1, wherein the supplying the silazene precursor includes supplying $Si_xH_yN_z$ between about 800 and 2,000 SCCM.

6. The method according to claim 1, wherein the supplying the oxidizer includes supplying at least one of ammonia ($NH_3$), nitrogen dioxide ($NO_2$), or ozone ($O_3$) between about 600 and 1,100 SCCM.

7. The method according to claim 6, wherein the supplying the oxidizer includes exciting the oxidizer to an ionized state using plasma.

8. The method according to claim 1, wherein the forming the second insulator includes forming a compressive stressing material.

9. The method according to claim 8, wherein the forming the second insulator includes forming at least one of high density plasma (HDP) oxide and undoped silicate glass (USG).

10. The method according to claim 1, further comprising:
conformably forming a trench liner on exposed surfaces of the first trench and the second trench prior to the forming the first insulator.

11. The method according to claim 10, wherein the forming the trench liner includes forming silicon nitride influencing compressive stresses.

* * * * *